(12) United States Patent
Goshi et al.

(10) Patent No.: US 10,566,182 B2
(45) Date of Patent: Feb. 18, 2020

(54) SUBSTRATE PROCESSING APPARATUS, SUBSTRATE PROCESSING METHOD, AND STORAGE MEDIUM

(71) Applicant: Tokyo Electron Limited, Tokyo (JP)

(72) Inventors: Gentaro Goshi, Kumamoto (JP); Keisuke Egashira, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 146 days.

(21) Appl. No.: 15/440,060

(22) Filed: Feb. 23, 2017

(65) Prior Publication Data

US 2017/0256397 A1 Sep. 7, 2017

(30) Foreign Application Priority Data

Mar. 2, 2016 (JP) .................................. 2016-040202
Mar. 2, 2016 (JP) .................................. 2016-040229

(51) Int. Cl.
*H01L 21/02* (2006.01)
*H01L 21/67* (2006.01)

(52) U.S. Cl.
CPC .. *H01L 21/02101* (2013.01); *H01L 21/67034* (2013.01)

(58) Field of Classification Search
CPC ......... H01L 21/02057; H01L 21/02101; H01L 21/67017; H01L 21/67023; H01L 21/67028; H01L 21/67034; H01L 21/67057; H01L 21/67109; H01L 21/67051; H01L 21/67155; H01L 21/67161; H01L 21/677; H01L 21/67703; H01L 21/67739; B08B 7/0021
See application file for complete search history.

(56) References Cited

U.S. PATENT DOCUMENTS 6,067,728 A * 5/2000 Farmer ............. H01L 21/67028
134/902
6,782,900 B2 * 8/2004 DeYoung ............. B08B 7/0021
134/105
(Continued)

FOREIGN PATENT DOCUMENTS

JP 2004-341009 A 12/2004
JP 2008-084890 A 4/2008
(Continued)

*Primary Examiner* — David G Cormier
(74) *Attorney, Agent, or Firm* — Abelman, Frayne & Schwab

(57) ABSTRACT

Disclosed is a substrate processing apparatus including a dry processing unit and a controller. The dry processing unit includes: a chamber that accommodates the substrate; a supercritical processing liquid supply unit that supplies a supercritical processing liquid to the substrate; a heating unit that heats an inside of the chamber; and a discharge unit that discharges a fluid in the chamber from the chamber. The controller controls the supercritical processing liquid supply unit, the heating unit, and the discharge unit such that the supercritical processing liquid is supplied to the substrate before or after the substrate is accommodated in the chamber, the inside of the chamber is heated to change the supercritical processing liquid into a supercritical fluid or a subcritical fluid, and the supercritical fluid or the subcritical fluid is discharged from the chamber.

14 Claims, 8 Drawing Sheets

(56) References Cited

U.S. PATENT DOCUMENTS

| | | | | |
|---|---|---|---|---|
| 7,195,676 | B2* | 3/2007 | McDermott | B08B 1/00 134/2 |
| 2004/0256594 | A1* | 12/2004 | Singh | A62D 1/0057 252/71 |
| 2012/0006356 | A1* | 1/2012 | Kamikawa | H01L 21/67051 134/10 |
| 2012/0031431 | A1* | 2/2012 | Carlson | B08B 7/0021 134/10 |
| 2014/0020721 | A1* | 1/2014 | Hayashi | H01L 21/02101 134/36 |

FOREIGN PATENT DOCUMENTS

| | | |
|---|---|---|
| JP | 2010-161165 A | 7/2010 |
| JP | 2011-187570 A | 9/2011 |
| JP | 2012-009705 A | 1/2012 |
| JP | 2012-151398 A | 8/2012 |
| JP | 2013-179245 A | 9/2013 |
| JP | 2014-022566 A | 2/2014 |

\* cited by examiner

SUBSTRATE PROCESSING APPARATUS, SUBSTRATE PROCESSING METHOD, AND STORAGE MEDIUM

CROSS-REFERENCE TO RELATED APPLICATIONS

This application is based on and claims priority from Japanese Patent Application Nos. 2016-040229 and 2016-040202 filed on Mar. 2, 2016 and Mar. 2, 2016, respectively, with the Japan Patent Office, the disclosures of which are incorporated herein in their entirety by reference.

TECHNICAL FIELD

The present disclosure relates to a substrate processing apparatus and a substrate processing method. In addition, the present disclosure relates to a storage medium that stores a program which, when executed, causes a computer to execute the substrate liquid processing method of the present disclosure.

BACKGROUND

In a manufacturing process of a semiconductor device in which a laminated structure of an integrated circuit is formed on the surface of, for example, a semiconductor wafer (hereinafter referred to as a "wafer") as a substrate, a liquid processing step is provided to process the surface of the wafer using a liquid, for example, to remove fine dust or a natural oxide film on the surface of the wafer surface with a cleaning liquid such as, for example, a chemical liquid.

There has been known a supercritical processing method using a fluid in a supercritical or subcritical state (which may also be collectively referred to as a "supercritical fluid") when removing a liquid or the like attached to the surface of the wafer in the liquid processing process.

When a liquid attached to the surface of the substrate surface is changed to a supercritical fluid or a subcritical fluid, alcohol such as, for example, isopropyl alcohol (IPA) (see, e.g., Japanese Patent Laid-open Publication No. 2013-179245), or hydrofluoroether (HFE) or hydrofluorocarbon (HFC) (see, e.g., Japanese Patent Laid-Open Nos. 2011-187570 and 2014-022566) may be used as a liquid source for the supercritical fluid or the subcritical fluid.

SUMMARY

A substrate processing apparatus of the present disclosure includes: a dry processing unit that performs a dry processing to dry a substrate; and a controller that controls an operation of the dry processing unit. The dry processing unit includes: a chamber that accommodates the substrate; a supercritical processing liquid supply unit that includes a reservoir that stores a supercritical processing liquid containing hydrofluoroolefin, and supplies the supercritical processing liquid to the substrate; a heating unit that heats an inside of the chamber; and a discharge unit that discharges a fluid in the chamber from the chamber. The controller controls the supercritical processing liquid supply unit, the heating unit, and the discharge unit such that the supercritical processing liquid is supplied to the substrate by the supercritical processing liquid supply unit before or after the substrate is accommodated in the chamber, the inside of the chamber is heated by the heating unit in a state where the substrate is accommodated in the chamber to change the supercritical processing liquid into a supercritical fluid or a subcritical fluid, and then, the supercritical fluid or the subcritical fluid is discharged from the chamber by the discharge unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
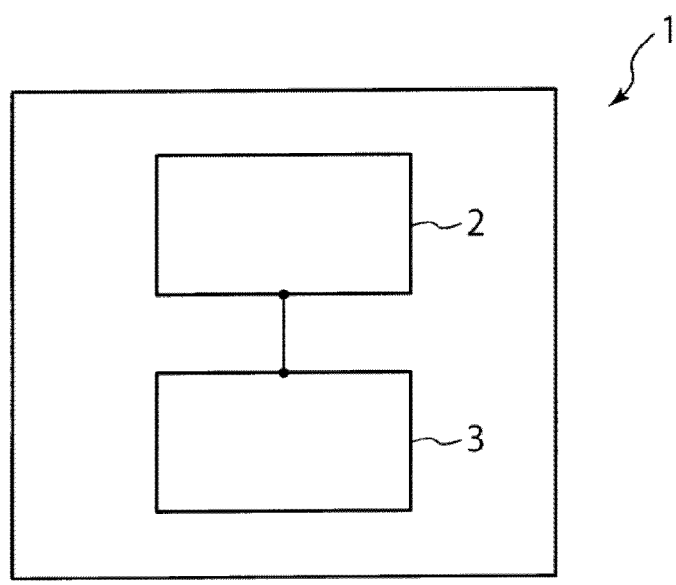
FIG. 1 is a schematic view illustrating a configuration of a substrate processing apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

An OH group possessed by alcohol (e.g., IPA) may damage a substrate. The OH group may oxidize, for example, tungsten in the substrate to generate tungsten oxide whiskers. Further, the OH group may etch silicon in the substrate and generate particles.

In addition, HFE and HFC may produce fluorine under a high temperature and high pressure condition which is used for changing a liquid into a supercritical fluid or a subcritical fluid. The produced fluorine may etch, for example, silicon in the substrate and causes thinning of the pattern of the substrate. Further, since fluorine-containing organic solvents (e.g., HFE and HFC) are expensive, facilities for recovery and regeneration are required in order to reduce the manufacturing cost.

Therefore, a liquid other than alcohol, HFE, and HFC are demanded as a liquid serving as a source of the supercritical fluid or the subcritical fluid.

Meanwhile, hydrofluoroolefins are small in global warming potential (GWP) and are easily decomposed by ultraviolet rays even when they are exhausted to the atmosphere as they are. In addition, the hydrofluoroolefins have both the property of being easily decomposed by ultraviolet rays and the property of being hardly decomposed by heating during a supercritical processing.

Therefore, the present disclosure is to provide a substrate processing apparatus and a substrate processing method capable of drying a substrate using a supercritical processing liquid containing hydrofluoroolefin as a liquid serving as a source of a supercritical fluid or a subcritical fluid. Further, the present disclosure is to provide a storage medium that stores a program which, when executed, cause a computer to execute the substrate liquid processing method.

The present disclosure includes the followings.

According to an aspect of the present disclosure, a substrate processing apparatus of the present disclosure includes: a dry processing unit that performs a dry processing to dry a substrate; and a controller that controls an operation of the dry processing unit. The controller controls the supercritical processing liquid supply unit, the heating unit, and the discharge unit such that the supercritical processing liquid is supplied to the substrate by the supercritical processing liquid supply unit before or after the substrate is accommodated in the chamber, the inside of the chamber is heated by the heating unit in a state where the substrate is accommodated in the chamber to change the supercritical processing liquid into a supercritical fluid or a subcritical fluid, and then, the supercritical fluid or the subcritical fluid is discharged from the chamber by the discharge unit. The controller controls the supercritical processing liquid supply unit, the heating unit, and the discharge unit such that the supercritical processing liquid is supplied to the substrate by the supercritical processing liquid supply unit before or after the substrate is accommodated in the chamber, the inside of the chamber is heated by the heating unit in a state where the substrate is accommodated in the chamber to change the supercritical processing liquid into a supercritical fluid or a subcritical fluid, and then, the supercritical fluid or the subcritical fluid is discharged from the chamber by the discharge unit.

In the above-described substrate processing apparatus, the hydrofluoroolefin is hydrochlorofluoroolefin.

In the above-described substrate processing apparatus, the dry processing unit further includes a recycling unit that regenerates a liquid from the fluid discharged by the discharge unit and supplies the regenerated liquid to the reservoir.

In the above-described substrate processing apparatus, the dry processing unit further includes a concentration adjusting unit that adjusts a concentration of the supercritical processing liquid stored in the reservoir, and the controller controls the recycling unit and the concentration adjusting unit such that the liquid regenerated by the recycling unit is supplied to the reservoir, and then, the concentration of the supercritical processing liquid stored in the reservoir is adjusted to a predetermined concentration.

In the above-described substrate processing apparatus, the dry processing unit further includes a substrate holding unit moving between an external position of the chamber and an internal position of the chamber in a state of holding the substrate, and the controller controls the supercritical processing liquid supply unit and the substrate holding unit such that the supercritical processing liquid is supplied to the substrate held by the substrate holding unit when the substrate holding unit is positioned at the external position or the internal position.

In the above-described substrate processing apparatus, the controller controls the supercritical processing liquid supply unit and the substrate holding unit such that the supercritical processing liquid is supplied to the substrate held by the substrate holding unit when the substrate holding unit is positioned at the external position, and the dry processing unit further includes a recycling unit that regenerates a gas evaporated from the supercritical processing liquid supplied to the substrate held by the substrate holding unit when the substrate holding unit is positioned at the external position and a liquid from the fluid discharged by the discharge unit, and supplies the regenerated liquid to the reservoir.

In the above-described substrate processing apparatus, the dry processing unit further includes a concentration adjusting unit that adjusts a concentration of the supercritical processing liquid stored in the reservoir, and the controller controls the recycling unit and the concentration adjusting unit such that the liquid regenerated by the recycling unit is supplied to the reservoir, and then, the concentration of the supercritical processing liquid stored in the reservoir is adjusted to a predetermined concentration.

In the above-described substrate processing apparatus, the supercritical processing liquid contains an organic solvent having a boiling point higher than that of the hydrofluoroolefin.

In the above-described substrate processing apparatus, a dry preventing liquid for preventing the drying of the substrate is filled on the surface of the substrate before the supercritical processing liquid is supplied to the surface of the substrate, the dry preventing liquid contains an organic solvent, and the organic solvent contained in the dry preventing liquid and the organic solvent contained in the supercritical processing liquid are the same in kind.

In the above-described substrate processing apparatus, the dry processing unit further includes a cooling unit that cools the supercritical processing liquid stored in the reservoir.

According to another aspect, the present disclosure provides a substrate processing method for drying a substrate in a chamber. The method includes: supplying a supercritical processing liquid that contains hydrofluoroolefin and is stored in a reservoir to the substrate unit before or after the substrate is accommodated in the chamber; heating an inside of the chamber in a state where the substrate is accommodated in the chamber to change the supercritical processing liquid supplied to the substrate into a supercritical fluid or a subcritical fluid; and discharging the supercritical fluid or the subcritical fluid from the chamber.

In the above-described substrate processing method, the hydrofluoroolefin is hydrochlorofluoroolefin.

The above-described substrate processing method further includes regenerating a liquid discharged from the discharging the supercritical fluid to supply the regenerated liquid to the reservoir.

The above-described substrate processing method further includes adjusting a concentration of the supercritical processing liquid stored in the reservoir to a predetermined concentration after the regenerated liquid is supplied to the reservoir.

In the above-described substrate processing method, in the supplying the supercritical liquid, the supercritical processing liquid stored in a reservoir is supplied to the substrate unit before the substrate is accommodated in the chamber, and the method further comprises: regenerating a gas evaporated from the supercritical processing liquid supplied to the substrate in the supplying the supercritical processing liquid and a liquid from the fluid discharged in the discharging the supercritical fluid or the subcritical fluid to supply the regenerated liquids to the reservoir.

The above-described substrate processing method further includes adjusting a concentration of the supercritical processing liquid stored in the reservoir to a predetermined concentration after the regenerated liquids are supplied to the reservoir.

In the above-described substrate processing method, the supercritical processing liquid contains an organic solvent having a boiling point higher than that of the hydrofluoroolefin.

In the above-described substrate processing method, a dry preventing liquid for preventing the drying of the substrate is filled on the surface of the substrate before the supercritical processing liquid is supplied, the dry preventing liquid contains an organic solvent, and the organic solvent contained in the dry preventing liquid and the organic solvent contained in the supercritical processing liquid are the same in kind.

The above-described substrate processing method further includes cooling the supercritical processing liquid stored in the reservoir.

According to still another aspect, the present disclosure provides a storage medium that stores a program for controlling a substrate processing apparatus which, when executed, cause a computer to control the substrate liquid processing apparatus and execute the above-described substrate liquid processing method.

According to an aspect of the present disclosure, a substrate processing apparatus of the present disclosure includes: a dry processing unit that performs a dry processing to dry a substrate; and a controller that controls operations of the dry processing unit. The dry processing unit includes: a chamber that accommodates the substrate; a chamber that accommodates the substrate; a dialkyl ether supply unit that supplies a liquid dialkyl ether represented by $R^1$—O—$R^2$ (wherein $R^1$ and $R^2$ represent the same or different alkyl groups) to the substrate; a heating unit that heats an inside of the chamber; and a discharge unit that discharges a fluid in the chamber from the chamber. The controller controls the dialkyl ether supply unit, the heating unit, and the discharge unit such that the liquid dialkyl ether is supplied to the substrate by the dialkyl ether supply unit before or after the substrate is accommodated in the chamber, the inside of the chamber is heated by the heating unit in a state where the substrate is accommodated in the chamber to change the supercritical processing liquid into a supercritical fluid or a subcritical fluid, and then, the supercritical fluid or the subcritical fluid is discharged from the chamber by the discharge unit.

In the above-described substrate processing apparatus, the liquid dialkyl ether is methyl tert-butyl ether.

In the above-described substrate processing apparatus, a dry preventing liquid for preventing the drying of the substrate is filled on the surface of the substrate before the liquid dialkyl ether is supplied to the surface of the substrate.

In the above-described substrate processing apparatus, the dry preventing liquid contains isopropyl alcohol.

In the above-described substrate processing apparatus, the dry preventing liquid contains propylene glycol monomethyl ether acetate.

In the above-described substrate processing apparatus, the dry processing unit further includes a substrate holding unit moving between an external position of the chamber and an internal position of the chamber in a state of holding the substrate, and the dialkyl ether supply unit supplies the liquid dialkyl ether to the substrate held by the substrate holding unit when the substrate holding unit is positioned at the external position or the internal position.

According to another aspect, the present disclosure provides a substrate processing method for drying a substrate in a chamber. The method includes: supplying a liquid dialkyl ether represented by $R^1$—O—$R^2$ (wherein $R^1$ and $R^2$ represent the same or different alkyl groups) to the substrate unit before or after the substrate is accommodated in the chamber; heating an inside of the chamber in a state where the substrate is accommodated in the chamber to change the liquid dialkyl ether supplied to the substrate into a supercritical fluid or a subcritical fluid; and discharging the supercritical fluid or the subcritical fluid from the chamber.

In the above-described substrate processing method, the liquid dialkyl ether is methyl tert-butyl ether.

In the above-described substrate processing method, a dry preventing liquid is filled on the surface of the substrate before the liquid dialkyl ether is supplied.

In the above-described substrate processing method, the dry preventing liquid contains isopropyl alcohol.

In the above-described substrate processing method, the dry preventing liquid contains propylene glycol monomethyl ether acetate.

In the above-described substrate processing method, the supplying the liquid dialkyl ether includes: holding the substrate in a substrate holding unit that moves between an external position of the chamber and an internal position of the chamber, and supplying the liquid dialkyl ether to the substrate held by the substrate holding unit when the substrate holding unit is positioned at the external position or the internal position.

According to still another aspect, the present disclosure provides a storage medium that stores a program for controlling a substrate processing apparatus which, when executed, cause a computer to control the substrate liquid processing apparatus and execute the above-described substrate liquid processing method.

According to the present disclosure, a substrate processing apparatus and a substrate processing method capable of drying a substrate using a supercritical processing liquid containing hydrofluoroolefin as a liquid serving as a source of a supercritical fluid or a subcritical fluid, and a storage medium that stores a program which, when executed, cause a computer to execute the substrate liquid processing method, are provided.

According to the present disclosure, a substrate processing apparatus and a substrate processing method capable of drying a substrate using a liquid that does not contain OH-groups and fluorine as a liquid serving as a source of a supercritical fluid or a subcritical fluid, and a storage medium that stores a program which, when executed, cause a computer to execute the substrate liquid processing method, are provided.

Hereinafter, exemplary embodiments of the present disclosure will be described with reference to the drawings.

<Configuration of Substrate Processing Apparatus>

Descriptions will be made on a configuration of a substrate processing apparatus according to an exemplary embodiment of the present disclosure with reference to FIG. 1. FIG. 1 is a schematic view illustrating a configuration of a substrate processing apparatus according to an exemplary embodiment of the present disclosure.

As illustrated in FIG. 1, a substrate processing apparatus 1 according to an exemplary embodiment of the present disclosure includes a substrate processing section 2 and a controller 3 that controls operations of the substrate processing section 2.

The substrate processing section 2 performs various processings on a substrate. The various processings performed by the substrate processing section 2 will be described later.

The controller 3 is, for example, a computer, and includes a main controller and a memory. The main controller is, for example, a central processing unit (CPU), and controls the operations of the substrate processing section 2 by reading and executing a program stored in the memory. The memory is constituted by a memory device such as, for example, a random access memory (RAM), a read only memory (ROM), or a hard disc, and stores a program that controls various processings performed in the substrate processing section 2. The program may be recorded in a computer-readable storage medium, and installed from the storage medium to the memory. The computer-readable storage medium may be, for example, a hard disc (HD), a flexible disc (FD), a compact disc (CD), a magnet optical disc (MO), or a memory card. The storage medium stores a program for controlling a substrate processing apparatus which, when executed, cause a computer to control the substrate liquid processing apparatus and execute the above-described substrate liquid processing method.

<Configuration of Substrate Processing Section>

Figure 2:
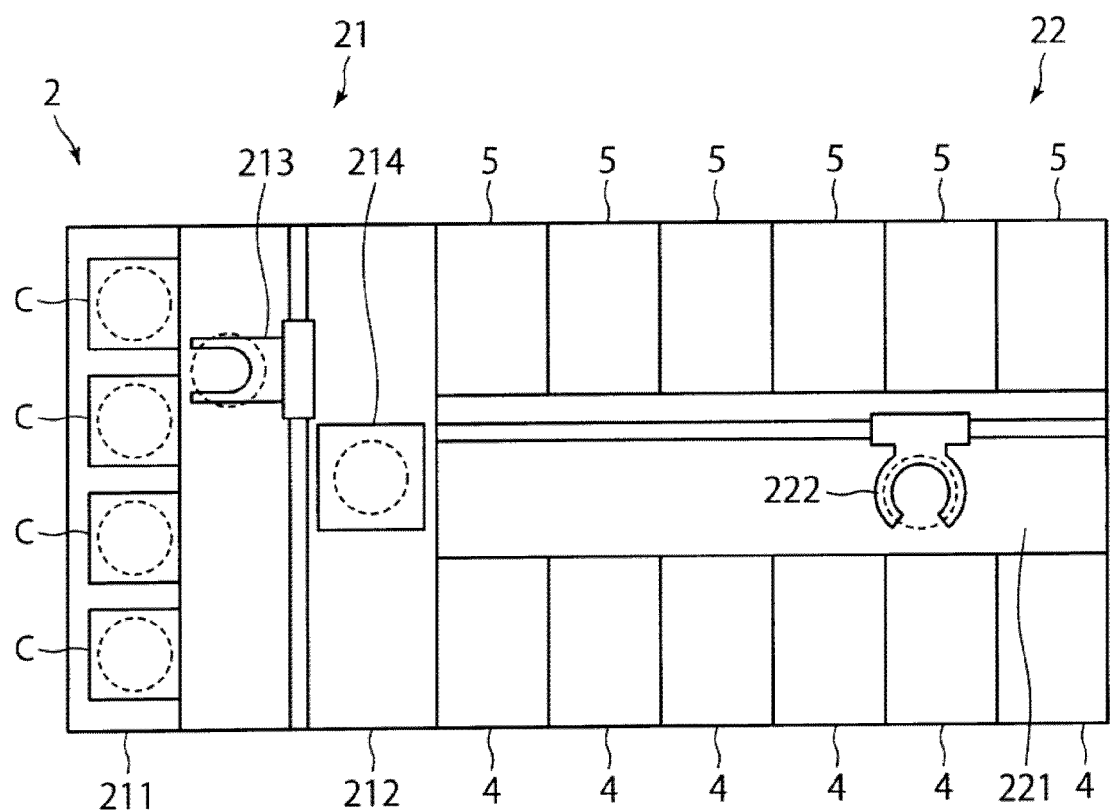
FIG. 2 is a schematic plan view illustrating a configuration of a substrate processing section provided in the substrate processing apparatus illustrated in FIG. 1.

Next, a specific configuration of a substrate processing section 2 will be described with reference to FIG. 2. FIG. 2 is a schematic plan view illustrating a configuration of the substrate processing section 2. The dotted lines in FIG. 2 indicate substrates.

The substrate processing section 2 performs various processings on the substrates. In the exemplary embodiment, substrate processings performed by the substrate processing section 2 include a cleaning processing for cleaning a substrate and a dry processing for drying the substrate after the cleaning processing (wet substrate).

The substrate processing section 2 includes a carry-in/out station 21 and a processing station 22 provided adjacent to the carry-in/out station 21.

The carry-in/out station 21 includes a placing unit 211 and a conveying unit 212 provided adjacent to the placing unit 211.

The placing unit 211 places thereon a plurality of conveyance container each accommodating a plurality of substrates in a horizontal state (hereinafter, referred to as a "carrier C").

The conveying unit 212 is provided with a conveyance mechanism 213 and a delivery unit 214. The conveyance mechanism 213 is provided with a holding mechanism that holds the substrate, and is configured to be movable in the horizontal direction and the vertical direction and pivotable about the vertical axis.

The processing station 22 includes cleaning processing units 4 that perform a cleaning processing to clean substrates, and dry processing units 5 that perform a dry processing to dry the substrates that have been subjected to the cleaning processing (wet substrates). In the exemplary embodiment, the number of cleaning processing units 4 provided in the processing station 22 is two (2) or more, but may be one (1). The same is applied to the dry processing units 5. In the exemplary embodiment, the cleaning processing units 4 are arranged on one side of a conveyance path 221 that extends in a predetermined direction, and the dry processing units 5 are arranged on the other side of the conveyance path 221. However, the arrangement of the cleaning processing units 4 and the dry processing unit 5 may be appropriately changed.

A conveyance mechanism 222 is provided in the conveyance path 221. The conveyance mechanism 222 is provided with a holding mechanism that holds the substrate, and is configured to be movable in the horizontal direction and the vertical direction and pivotable about the vertical axis. The conveyance mechanism 222 may have a mechanism to suppress vaporization (evaporation) of a dry preventing liquid filled on the surface of the substrate therefrom during the conveyance. Examples of such a mechanism include a cooling mechanism that cools the dry preventing liquid on the substrate held by the conveyance mechanism 222, and a cover mechanism that suppresses contact of the dry preventing liquid on the substrate held by the conveyance mechanism 222 with the outside air.

Figure 7:
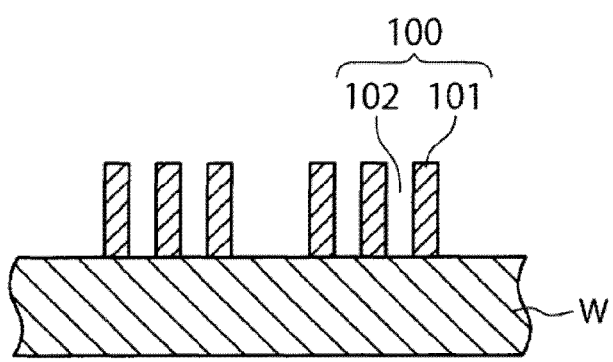
FIG. 7 is a schematic cross-sectional view illustrating a configuration of a substrate processed in the substrate processing apparatus illustrated in FIG. 1.

The substrate to be subjected to a substrate processing by the substrate processing section 2 is, for example, a substrate W on which a concavo-convex pattern 100 including a convex portion 101 and a concave portion 102 is formed as illustrated in FIG. 7. The substrate W is, for example, a semiconductor wafer. Hereinafter, the substrate to be subjected to a substrate processing by the cleaning processing unit 4 will be referred to as a "substrate W1," the substrate which has been subjected to the substrate processing by the cleaning processing unit 4 (substrate to be subjected to a substrate processing by the dry processing unit 5) will be referred to as a "substrate W2," and the substrate which has been subjected to the substrate processing by the dry processing unit 5 will be referred to as a "substrate W3."

In the substrate processing section 2, the conveyance mechanism 213 of the carry-in/out station 21 conveys the substrates W1, W3 between a carrier C and the delivery unit 214. Specifically, the conveyance mechanism 213 takes out the substrate W1 from the carrier C placed on the placing unit 211, and places the taken-out substrate W1 on the delivery section 214. In addition, the conveyance mechanism 213 takes out the substrate W3 placed on the delivery unit 214 by the conveyance mechanism 222 of the processing station 22, and stores the substrate W3 in the carrier C of the placing unit 211.

In the substrate processing section 2, the conveyance mechanism 222 of the carry-in/out station 22 conveys the substrates W1, W2, W3 between the delivery unit 214 and the cleaning processing unit 4, between the cleaning processing unit 4 and the dry processing unit 5, and between the dry processing unit 5 and the delivery unit 214. Specifically, the conveyance mechanism 222 takes out the substrate W1 placed on the delivery unit 214, and carries the taken-out substrate W1 into the cleaning processing unit 4. Further, the conveyance mechanism 222 takes out the substrate W2 from the cleaning processing unit 4, and carries the taken-out substrate W2 into the dry processing unit 5. Further, the conveyance mechanism 222 takes out the substrate W3 from the dry processing unit 5, and places the taken-out substrate W3 on the delivery unit 214.

<Configuration 01 of Cleaning Processing Unit>

Figure 3A:
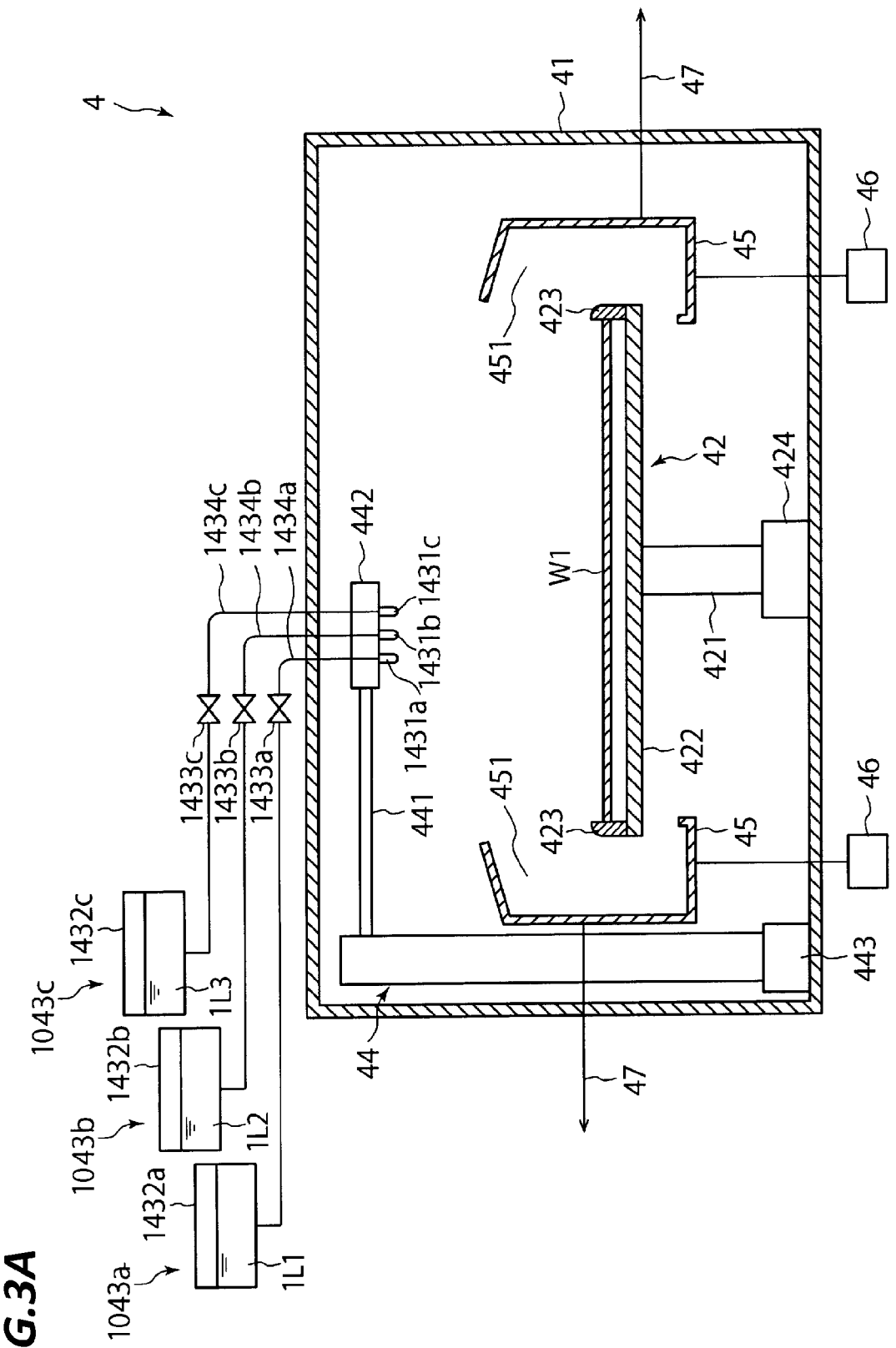
FIG. 3A is a schematic plan view illustrating a configuration of a substrate processing section provided in the substrate processing apparatus illustrated in FIG. 2.

Next, a configuration of the cleaning processing unit 4 will be described with reference to FIG. 3A. FIG. 3A is a schematic cross-sectional view illustrating a configuration of the cleaning processing unit 4.

The cleaning processing unit 4 performs a cleaning processing on the substrate W1 carried into the cleaning processing unit 4. Deposits (e.g., particles and organic substances) attached to the surface of the substrate W1 may be removed from the surface of the substrate W1 by the cleaning processing. The substrate processing performed by the cleaning processing unit 4 is not particularly limited as long as the cleaning processing on the substrate W1 is included. Therefore, the processing performed by the cleaning processing unit 4 may include processings other than the cleaning processing. In the exemplary embodiment, the substrate processing performed by the cleaning processing unit 4 includes, for example, a rinse processing and a dry preventing liquid supply processing in addition to the cleaning processing.

The cleaning processing unit 4 includes a chamber 41, and performs the substrate processing including the cleaning processing in the chamber 41.

The cleaning processing unit 4 includes a substrate holding unit 42. The substrate holding unit 42 includes a rotary shaft 421 that extends in the vertical direction in the chamber 41, a turntable 422 that is attached to the upper end of the rotary shaft 421, and a chuck 423 that is provided on the outer peripheral portion of the upper surface of the turntable 422 and supports the outer edge portion of the substrate W1, and a driving unit 424 that rotationally drives the rotation shaft 421.

The substrate W1 is supported by the chuck 423 and held horizontally on the turntable 422 in a state of being slightly separated from the upper surface of the turntable 422. In the exemplary embodiment, the holding method of the substrate W1 by the substrate holding unit 42 is a so-called mechanical chuck type method in which the outer edge portion of the substrate W1 is gripped by the movable chuck 423, but may be a so-called vacuum chuck type method in which the rear surface of the substrate W1 is vacuum-adsorbed.

A proximal end portion of the rotary shaft 421 is rotatably supported by the driving unit 424, and a distal end portion of the rotary shaft 421 horizontally supports the turntable 422. When the rotary shaft 421 rotates, the turntable 422 attached to the upper end portion of the rotary shaft 421 rotates, so that the substrate W1 held by the turntable 422 rotates while being supported by the chuck 423. The controller 3 controls the operation of the driving unit 424 to control, for example, the rotation timing, rotation speed, and rotation time of the substrate W1.

The cleaning processing unit 4 includes a cleaning liquid supply unit 1043a, a rinse liquid supply unit 1043b, and a dry preventing liquid supply unit 1043c that supply a cleaning liquid 1L1, a rinse liquid 1L2, and a dry preventing liquid 1L3, respectively, to the substrate W1 held by the substrate holding unit 42. The controller 3 controls the cleaning liquid supply unit 1043a, the rinse liquid supply unit 1043b, and the dry preventing liquid supply unit 1043c to control the rotation timing, rotation speed, and rotation time of the various processing liquids.

The cleaning liquid supply unit 1043a includes a nozzle 1431a that ejects the cleaning liquid 1L1 to the substrate W1 held by the substrate holding unit 42, and a cleaning liquid source 1432a that supplies the cleaning liquid 1L1 to the nozzle 1431a. The cleaning liquid 1L1 is stored in a tank provided in the cleaning liquid source 1432a. The cleaning liquid 1L1 is supplied to the nozzle 1431a from the cleaning liquid source 1432a through a supply pipe line 1434a in which a flow rate adjustor 1433a (e.g., a valve) is interposed. Examples of the cleaning liquid 1L1 include an SC1 liquid (mixed liquid of ammonia and hydrogen peroxide) which is an alkaline chemical liquid, and a dilute hydrofluoric acid aqueous solution (DHF) which is an acidic chemical liquid. The SC1 liquid may be used as a cleaning liquid to remove deposits such as, for example, particles and organic substances from the surface of the substrate W1. The DHF may be used as a cleaning liquid to remove an oxide film from the surface of the substrate W1. The cleaning liquid supply unit 1043a may be configured to separately supply two or more kinds of cleaning liquids to the nozzle 1431a.

The rinse liquid supply unit 1043b includes a nozzle 1431b that ejects the rinse liquid 1L2 to the substrate W1 held by the substrate holding unit 42, and a rinse liquid source 1432b that supplies the rinse liquid 1L2 to the nozzle 1431b. The rinse liquid 1L2 is stored in a tank provided in the rinse liquid source 1432b. The rinse liquid 1L2 is supplied to the nozzle 1431b from the rinse liquid source 1432b through a supply pipe line 1434b in which a flow rate adjustor 1433b (e.g., a valve) is interposed. Examples of the rinse liquid 1L2 include deionized water (DIW).

The dry preventing liquid supply unit 1043c includes a nozzle 1431c that ejects the dry preventing liquid 1L3 to the substrate W1 held by the substrate holding unit 42, and a dry preventing liquid source 1432c that supplies the dry preventing liquid 1L3 to the nozzle 1431c. The dry preventing liquid 1L3 is stored in a tank provided in the rinse liquid source 1432c. The dry preventing liquid 1L3 is supplied to the nozzle 1431c from the dry preventing liquid source 1432c through a supply pipe line 1434c in which a flow rate regulator 1433c (e.g., a valve) is interposed. The dry preventing liquid 1L3 may contain an organic solvent. Examples of the organic solvent contained in the dry preventing liquid 1L3 include alcohol such as, for example, isopropyl alcohol (IPA).

The cleaning processing unit 4 includes a nozzle moving mechanism 44 that drives the nozzles 1431a to 1431c. The nozzle moving mechanism 44 includes an arm 441, a moving body 442 with a built-in driving mechanism that is movable along the arm 441, and a pivoting and lifting mechanism 443 that pivots and lifts the arm 441. The nozzles 1431a to 1431c are attached to the movable body 442. The nozzle moving mechanism 44 is able to move the nozzles 1431a to 1431c between an upper position of the center of the substrate W1 held by the substrate holding unit 42 and an upper position of the peripheral portion of the substrate W1. Furthermore, the nozzle moving mechanism 44 is able to move the nozzles 1431a to 1431c to a standby position outside a cup 45 (to be described later) in a plan view. In the exemplary embodiment, the nozzles 1431a to 1431c are held by a common arm, but may be held by separate arms to independently move.

The cleaning processing unit 4 includes a cup 45 having a discharge port 451. The cup 45 is provided around the substrate holding unit 42, and receives various processing liquids (e.g., the cleaning liquid, the rinse liquid, and the dry preventing liquid) scattered from the substrate W1. The cup 45 is provided with a lifting mechanism 46 that drives the cup 45 in the vertical direction, and a liquid discharge mechanism 47 that collects the various processing liquids scattered from the substrate W1 in the discharge port 451 and discharges the collected processing liquids therefrom.

The cleaning processing unit 4 may perform a single substrate type cleaning processing that cleans the substrates W1 one by one by spin cleaning. The cleaning processing may be performed, for example, in the following order: cleaning with SC1 liquid→rinsing with DIW→cleaning with DHF→rinsing with DIW. During the cleaning processing, the atmosphere in the chamber 41 may be exhausted from an exhaust port (not illustrated).

<Configuration 02 of Cleaning Processing Unit>

Figure 3B:
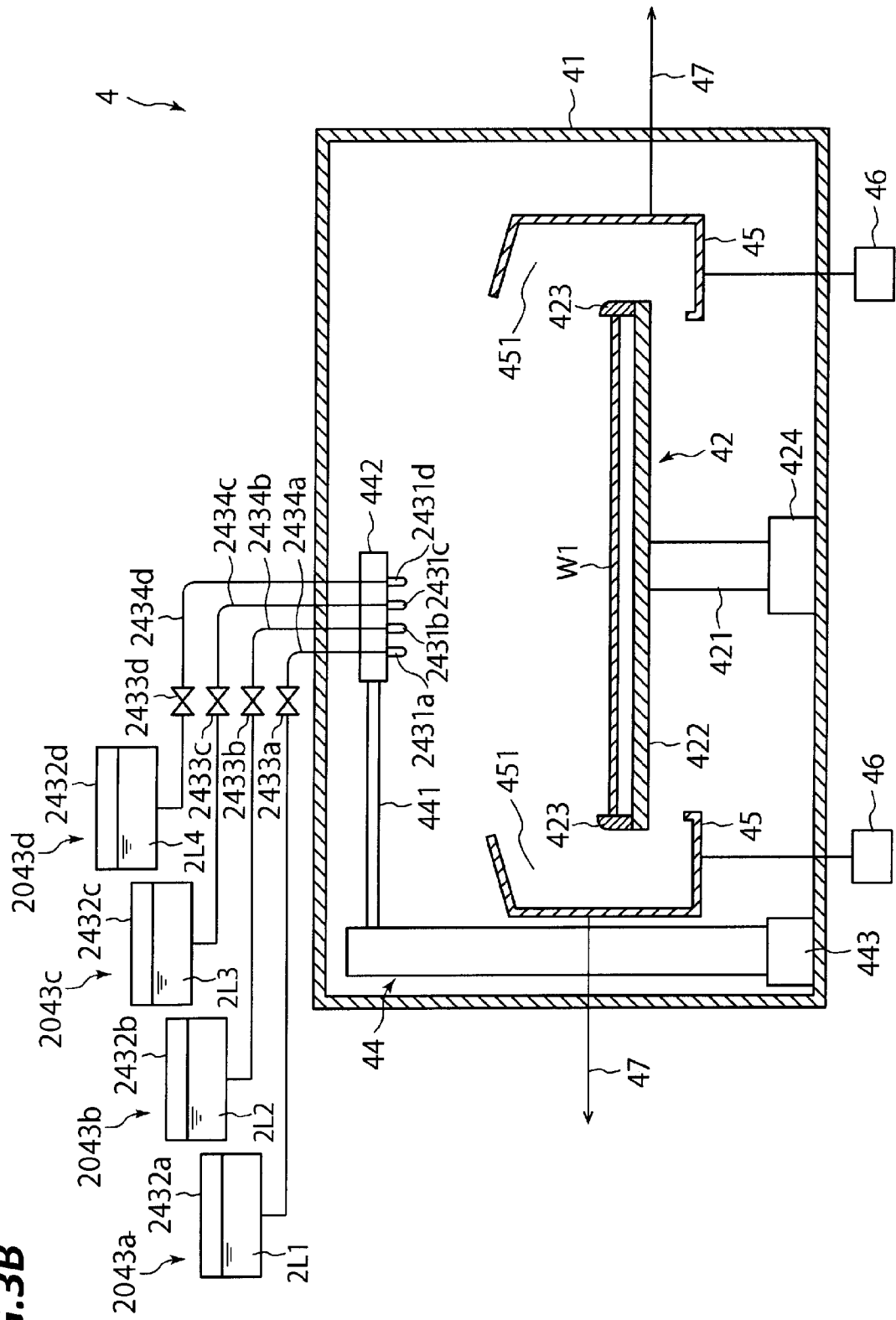
FIG. 3B is a schematic cross-sectional view illustrating a configuration of the cleaning processing unit provided in the substrate processing section illustrated in FIG. 2.

Next, a configuration of the cleaning processing unit 4 will be described with reference to FIG. 3B. FIG. 3B is a schematic cross-sectional view illustrating a configuration of the cleaning processing unit 4.

The cleaning processing unit 4 performs a cleaning processing on the substrate W1 carried into the cleaning processing unit 4. Deposits (e.g., particles and organic substances) attached to the surface of the substrate W1 may be removed from the surface of the substrate W1 by the cleaning processing. The substrate processing performed by the cleaning processing unit 4 is not particularly limited as long as the cleaning processing on the substrate W1 is included. Therefore, the processing performed by the cleaning processing unit 4 may include processings other than the cleaning processing. In the exemplary embodiment, the substrate processing performed by the cleaning processing unit 4 includes, for example, a rinse processing and a dry preventing liquid supply processing in addition to the cleaning processing.

The cleaning processing unit 4 includes a chamber 41, and performs the substrate processing including the cleaning processing in the chamber 41.

The cleaning processing unit 4 includes a substrate holding unit 42. The substrate holding unit 42 includes a rotary shaft 421 that extends in the vertical direction in the chamber 41, a turntable 422 that is attached to the upper end of the rotary shaft 421, and a chuck 423 that is provided on the outer peripheral portion of the upper surface of the turntable 422 and supports the outer edge portion of the substrate W1, and a driving unit 424 that rotationally drives the rotation shaft 421.

The substrate W1 is supported by the chuck 423 and held horizontally on the turntable 422 in a state of being slightly separated from the upper surface of the turntable 422. In the exemplary embodiment, the holding method of the substrate W1 by the substrate holding unit 42 is a so-called mechanical chuck type method in which the outer edge portion of the substrate W1 is gripped by the movable chuck 423, but may be a so-called vacuum chuck type method in which the rear surface of the substrate W1 is vacuum-adsorbed.

A proximal end portion of the rotary shaft 421 is rotatably supported by the driving unit 424, and a distal end portion of the rotary shaft 421 horizontally supports the turntable 422. When the rotary shaft 421 rotates, the turntable 422 attached to the upper end portion of the rotary shaft 421 rotates, so that the substrate W1 held by the turntable 422 rotates while being supported by the chuck 423. The controller 3 controls the operation of the driving unit 424 to control, for example, the rotation timing, rotation speed, and rotation time of the substrate W1.

The cleaning processing unit 4 includes a cleaning liquid supply unit 2043a, a rinse liquid supply unit 2043b, a first dry preventing liquid supply unit 2043c, and a second dry preventing liquid supply unit 2043d that supply a cleaning liquid 2L1, a rinse liquid 2L2, a first dry preventing liquid 2L3, and a second dry preventing liquid 2L4, respectively, to the substrate W1 held by the substrate holding unit 42. The controller 3 controls the cleaning liquid supply unit 2043a, the rinse liquid supply unit 2043b, the first dry preventing liquid supply unit 2043c, and the second dry preventing liquid supply unit 2043d to control the rotation timing, rotation speed, and rotation time of the various processing liquids. In the exemplary embodiment, the cleaning processing unit 4 includes the first dry preventing liquid supply unit 2043c and the second dry preventing liquid supply unit 2043d. However, the cleaning processing unit 4 may not include the second dry preventing liquid supply unit 2043d. In an exemplary embodiment in which the cleaning processing unit 4 includes the first dry preventing liquid supply unit 2043c and the second dry preventing liquid supply unit 2043d, a part of the first dry preventing liquid 2L3 filled on the surface of the substrate may be replaced with the second dry preventing liquid 2L4. For example, in a case where IPA is used as the first dry preventing liquid supply unit 2043c and PGMEA is used as the second dry preventing liquid supply unit 2043d, when a part of the IPA filled on the surface of the substrate is replaced with the PGMEA, the surface of the substrate is further suppressed from being dried as compared with a case of IPA alone. Thus, the function as a dry preventing liquid may be enhanced. Further, unlike IPA, PGMEA does not have an OH group. Thus, PGMEA does not form a Lewis acid or a complex with a metal such as, for example, tungsten (W), and does not cause any damage such as W whisker.

The cleaning liquid supply unit 2043a includes a nozzle 2431a that ejects the cleaning liquid 2L1 to the substrate W1 held by the substrate holding unit 42, and a cleaning liquid source 2432a that supplies the cleaning liquid 2L1 to the nozzle 2431a. The cleaning liquid 2L1 is stored in a tank provided in the cleaning liquid source 2432a. The cleaning liquid 2L1 is supplied to the nozzle 2431a from the cleaning liquid source 2432a through a supply pipe line 2434a in which a flow rate adjustor 2433a (e.g., a valve) is interposed. Examples of the cleaning liquid 2L1 include a SC1liquid (mixed liquid of ammonia and hydrogen peroxide) which is an alkaline chemical liquid, and a dilute hydrofluoric acid aqueous solution (DHF) which is an acidic chemical liquid. The SC1liquid may be used as a cleaning liquid to remove deposits such as, for example, particles and organic substances from the surface of the substrate W1. The DHF may be used as a cleaning liquid to remove an oxide film from the surface of the substrate W1. The cleaning liquid supply unit 2043a may be configured to separately supply two or more kinds of cleaning liquids to the nozzle 2431a.

The rinse liquid supply unit 2043b includes a nozzle 2431b that ejects the rinse liquid 2L2 to the substrate W1 held by the substrate holding unit 42, and a rinse liquid source 2432b that supplies the rinse liquid 2L2 to the nozzle 2431b. The rinse liquid 2L2 is stored in a tank provided in the rinse liquid source 2432b. The rinse liquid 2L2 is supplied to the nozzle 2431b from the rinse liquid source 2432b through a supply pipe line 2434b in which a flow rate adjustor 2433b (e.g., a valve) is interposed. Examples of the rinse liquid 2L2 include deionized water (DIW).

The first dry preventing liquid supply unit 2043c includes a nozzle 2431c that ejects the first dry preventing liquid 2L3 to the substrate W1 held by the substrate holding unit 42, and a dry preventing liquid source 2432c that supplies the first dry preventing liquid 2L3 to the nozzle 2431c. The first dry preventing liquid 2L3 is stored in a tank provided in the dry preventing liquid source 2432c. The first dry preventing liquid 2L3 is supplied to the nozzle 2431c from the dry preventing liquid source 2432c through a supply pipe line 2434c in which a flow rate regulator 2433c (e.g., a valve) is interposed. Examples of the dry preventing liquid 2L3 include alcohol such as, for example, isopropyl alcohol (IPA).

The second dry preventing liquid supply unit 2043d includes a nozzle 2431d that ejects the second dry preventing liquid 2L4 to the substrate W1 held by the substrate holding unit 42, and a dry preventing liquid source 2432d that supplies the second dry preventing liquid 2L4 to the nozzle 2431d. The second dry preventing liquid 2L4, which is different in kind from the first dry preventing liquid 2L3, is stored in a tank provided in the dry preventing liquid source 2432d. The second dry preventing liquid 2L4 is supplied to the nozzle 2431d from the dry preventing liquid source 2432d through a supply pipe line 2434d in which a flow rate regulator 2433d (e.g., a valve) is interposed. Examples of the dry preventing liquid 2L4 include alcohol such as, for example, propylene glycol monomethyl ether acetate (PGMEA).

The cleaning processing unit 4 includes a nozzle moving mechanism 44 that drives the nozzles 2431a to 2431d. The nozzle moving mechanism 44 includes an arm 441, a moving body 442 with a built-in driving mechanism that is movable along the arm 441, and a pivoting and lifting mechanism 443 that pivots and lifts the arm 441. The nozzles 2431a to 2431d are attached to the movable body 442. The nozzle moving mechanism 44 is able to move the nozzles 2431a to 2431d between an upper position of the center of the substrate W1 held by the substrate holding unit 42 and an upper position of the peripheral portion of the substrate W1. Furthermore, the nozzle moving mechanism 44 is able to move the nozzles 2431a to 2431d to a standby position outside a cup 45 (to be described later) in a plan view. In the exemplary embodiment, the nozzles 2431a to 2431d are held by a common arm, but may be held by separate arms to independently move.

The cleaning processing unit 4 includes a cup 45 having a discharge port 451. The cup 45 is provided around the substrate holding unit 42, and receives various processing liquids (e.g., the cleaning liquid, the rinse liquid, and the dry preventing liquid) scattered from the substrate W1. The cup 45 is provided with a lifting mechanism 46 that drives the cup 45 in the vertical direction, and a liquid discharge mechanism 47 that collects the various processing liquids scattered from the substrate W1 in the discharge port 451 and discharges the collected processing liquids therefrom.

The cleaning processing unit 4 may perform a single substrate type cleaning processing that cleans the substrates W1 one by one by spin cleaning. The cleaning processing may be performed, for example, in the following order: cleaning with SC1 liquid→rinsing with DIW→cleaning with DHF→rinsing with DIW. During the cleaning processing, the atmosphere in the chamber 41 may be exhausted from an exhaust port (not illustrated).

<Configuration 01 of Dry Processing Unit>

Figure 4:
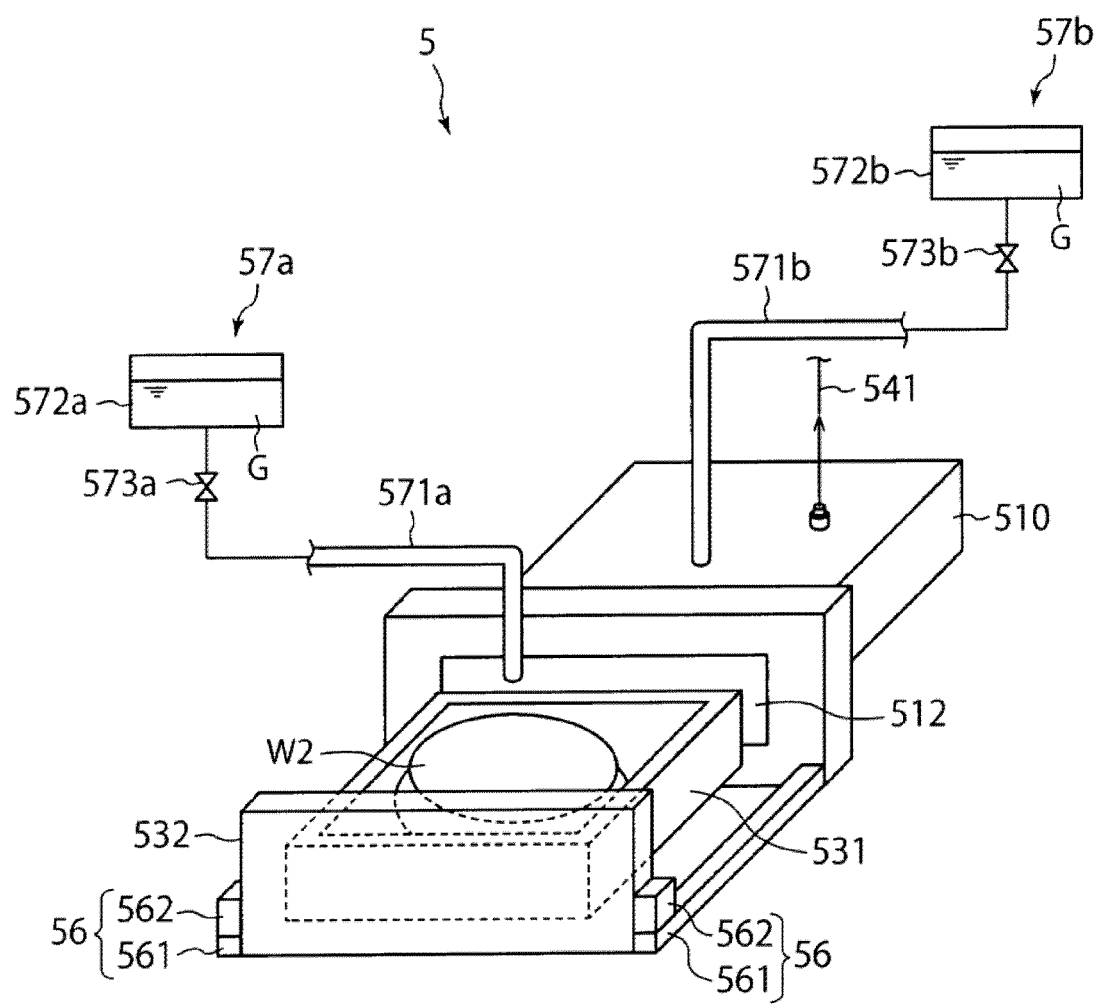
FIG. 4 is a schematic perspective view illustrating a configuration of a dry processing unit provided in the substrate processing section illustrated in FIG. 2.
Figure 5:
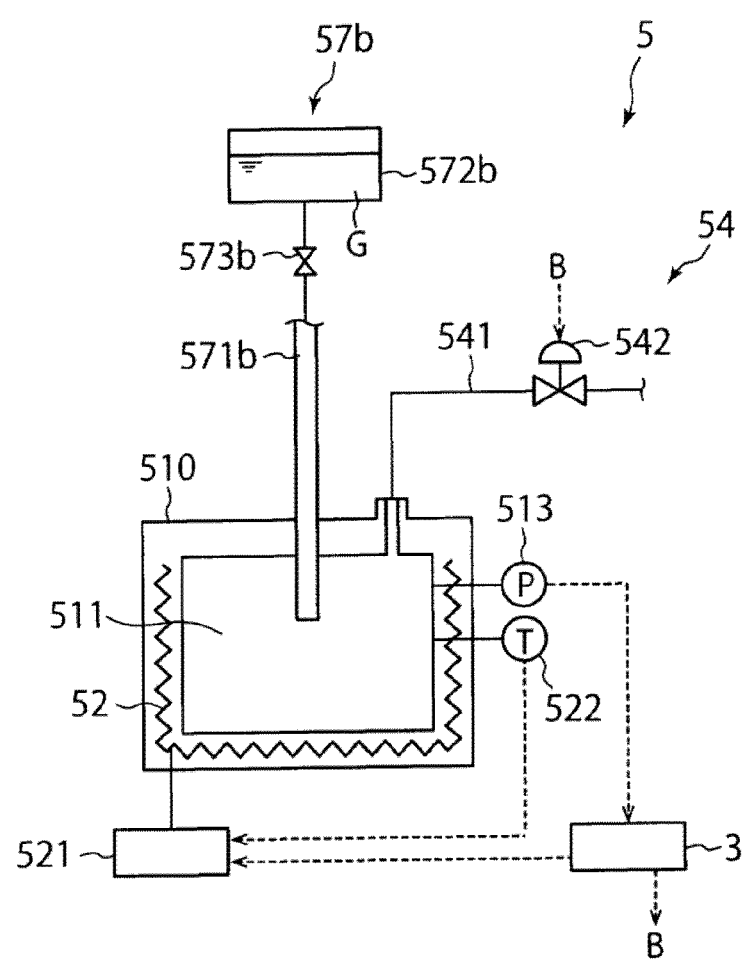
FIG. 5 is a schematic cross-sectional view illustrating a configuration of the dry processing unit provided in the substrate processing section illustrated in FIG. 2.
Figure 6:
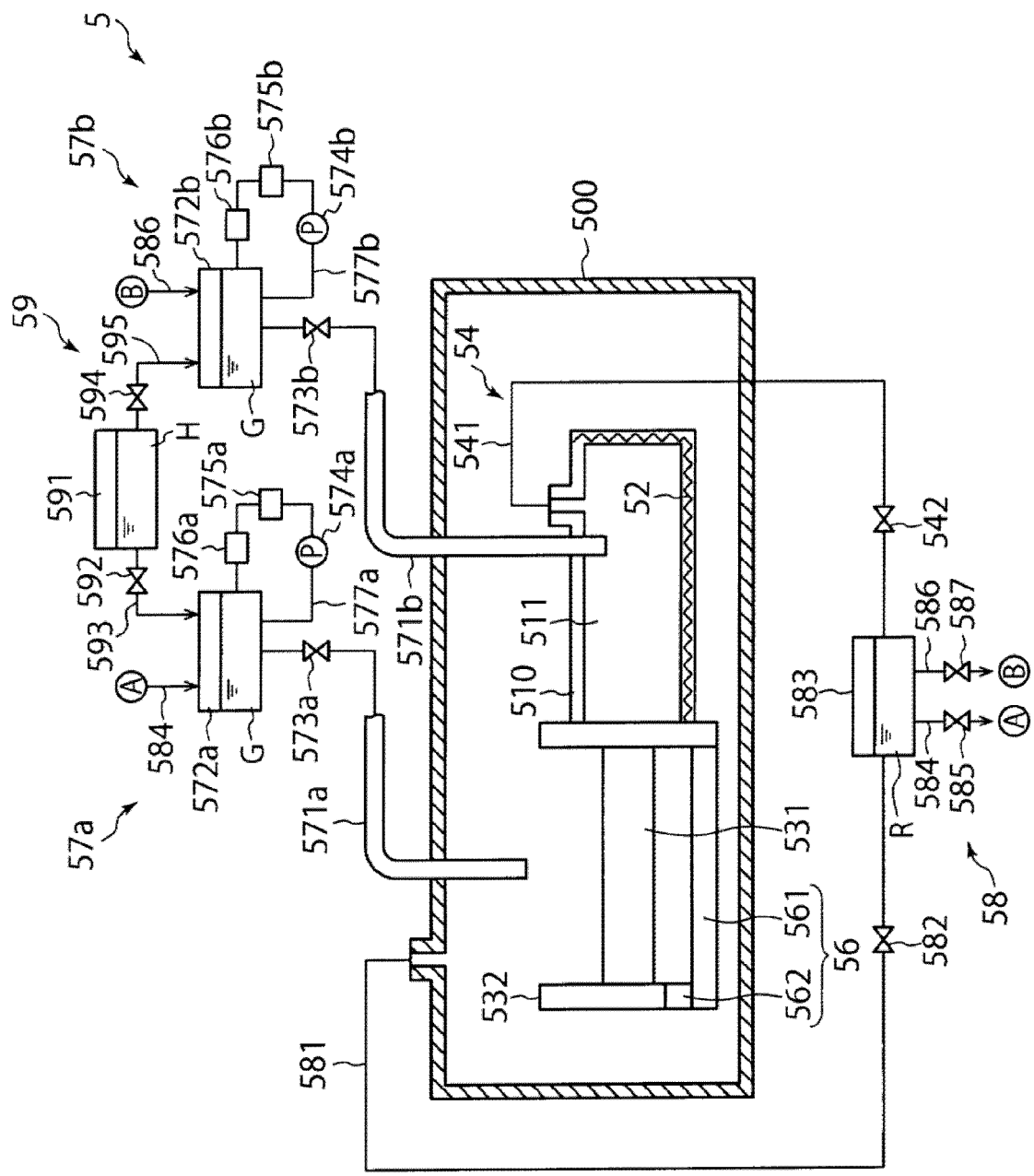
FIG. 6 is a schematic cross-sectional view illustrating a configuration of the dry processing unit provided in the substrate processing section illustrated in FIG. 2.

Next, a specific configuration of a dry processing unit 5 will be described with reference to FIGS. 4 to 6. FIG. 4 is a schematic perspective view illustrating a configuration of the dry processing unit 5, and FIGS. 5 and 6 are schematic cross-sectional views illustrating the configuration of the dry processing unit 5.

The dry processing unit 5 performs a dry processing on the substrate W2 which have been subjected to a substrate processing by the cleaning processing unit 4. The substrate W2 which have been subjected to a substrate processing by the cleaning processing unit 4 is in a wet state by the dry preventing liquid 1L3 filled on the surface thereof. The substrate processing performed by the dry processing unit 5 is not particularly limited as long as the dry processing is included. Therefore, the processing performed by the dry processing unit 5 may include processings other than the dry processing.

The dry processing unit 5 includes a chamber 500, and performs the substrate processing including the dry processing in the chamber 500. Hydrofluoroolefin is liable to be decomposed by ultraviolet rays. Thus, in order to suppress hydrofluoroolefin from being decomposed by ultraviolet rays before the supercritical processing, the dry processing chamber 500 may be made of an ultraviolet impermeable material. Alternatively, the dry processing chamber 500 may be subjected to a surface treatment that imparts ultraviolet impermeability.

The dry processing unit 5 includes a supercritical processing chamber 510 provided in the dry processing chamber 500, and performs the substrate processing including the supercritical processing in the supercritical processing chamber 510. The expression "supercritical processing" is used to cover not only a process of changing a liquid into a supercritical fluid but also a process of changing a liquid into a subcritical fluid. Hydrofluoroolefin is liable to be decomposed by ultraviolet rays. Thus, in order to suppress hydrofluoroolefin from being decomposed by ultraviolet rays before the supercritical processing, the supercritical processing chamber 510 may be made of an ultraviolet impermeable material. Alternatively, the supercritical processing chamber 510 may be subjected to a surface treatment that imparts ultraviolet impermeability.

The supercritical processing chamber 510 includes an inner space 511 and an opening 512 leading to the inner space 511. The inner space 511 and the opening 512 are defined by the wall portion of the supercritical processing chamber 510. The supercritical processing chamber 510 is configured to seal the inner space 511 by sealing the opening 512. The inner space 511 is a space capable of accommodating the substrate W2. In the exemplary embodiment, since the substrate W2 is accommodated in the inner space 511 in a state of being held by a substrate holding portion 531, the inner space 511 is a space capable of accommodating the substrate holding unit 531 that holds the substrate W2. The size of the inner space 511 is, for example, about 200 to 10,000 $cm^3$. The carry-in/out of the substrate W2 into/from the internal space 511 is performed through the opening 512.

The supercritical processing chamber 510 includes a pressure-resistant container. Examples of the pressure-resistant container include a pressure-resistant container made of a material having a high pressure resistance but a relatively low thermal conductivity such as, for example, stainless steel, carbon steel, titanium, Hastelloy (registered trademark), or Inconel (registered trademark). An inner container made of a material having higher thermal conductivity than that of the pressure-resistant container (e.g., aluminum, copper, aluminum nitride, or silicon carbide) is provided inside the pressure-resistant container in a nested structure. The internal container may be heated. A thermal insulation layer made of, for example, quartz or alumina is provided between the pressure-resistant container and the inner container, and only the inner container is heated, so that the thermal responsiveness of the supercritical processing chamber 510 may be improved, and energy consumption may be reduced.

The dry processing unit 5 includes the substrate holding unit 531 that holds the substrate W2. The substrate holding unit 531 is configured to hold the substrate W2 transversely in a state of being immersed in a liquid (e.g., a supercritical processing liquid G supplied from a first supercritical processing liquid supply unit 57a and/or a second supercritical processing liquid supply unit 57b). Hydrofluoroolefin is liable to be decomposed by ultraviolet rays. Thus, in order to suppress hydrofluoroolefin from being decomposed by ultraviolet rays before the supercritical processing, the substrate holding unit 531 may be made of an ultraviolet impermeable material. Alternatively, the substrate holding unit 531 may be subjected to a surface treatment that imparts ultraviolet impermeability.

The dry processing unit 5 includes a cover member 532 provided in the substrate holding unit 531. The cover member 532 is configured to seal the opening 512 of the supercritical processing chamber 510 when the substrate holding portion 531 is accommodated in the inner space 511 of the supercritical processing chamber 510. Hydrofluoroolefin is liable to be decomposed by ultraviolet rays. Thus, in order to suppress hydrofluoroolefin from being decomposed by ultraviolet rays before the supercritical processing, the cover member 532 may be made of an ultraviolet impermeable material. Alternatively, the cover member 532 may be subjected to a surface treatment that imparts ultraviolet impermeability.

The dry processing unit 5 includes a transfer mechanism 56 that enables the substrate holding unit 531 to move between an external position of the supercritical processing chamber 510 (a position where the substrate W2 is delivered to and from the substrate holding unit 531) and an internal position of the supercritical processing chamber 510 (a position where the supercritical processing is performed on the substrate W2 held by the substrate holding unit 531). The transfer mechanism 56 is a slide mechanism including a rail 561 extending in a movement direction of the substrate holding unit 531 and a slider 562 with a built-in driving mechanism that travels on the rail 561, and is provided on both sides of the substrate holding unit 531. The slider 562 is connected to the cover member 532. Therefore, as the slider 562 moves along the rail 561, the cover member 532 and the substrate holding unit 531 connected to the cover member 532 also move along the rail 561. Specifically, when the slider 562 moves to one end portion of the rail 561, the substrate holding unit 531 is able to move to the external position of the supercritical processing chamber 510. When the slider 562 moves to the other end portion of the rail 561, the substrate holding unit 531 is able to move to the internal position of the supercritical processing chamber 510.

The dry processing unit 5 includes a heating unit 52 that heats the inside of the supercritical processing chamber 510. The heating unit 52 is a heater made of, for example, a heating resistor, and is provided in the wall portion of the supercritical processing chamber 510. The heating unit 52 may heat the substrate W2 in the supercritical processing chamber 510 through heating of the inside of the supercritical processing chamber 510. The heating unit 52 may change the heat generation amount by a power supplied from a power supply unit 521, and may increase the temperature in the supercritical processing chamber 510 according to a predetermined heating schedule, based on, for example, a temperature detection result acquired from a temperature detection unit 522 or a pressure detection result of a pressure detection unit 513.

The dry processing unit 5 includes a first supercritical processing liquid supply unit 57a that supplies a supercritical processing liquid G containing hydrofluoroolefin to the substrate W2 held by the substrate holding unit 531 when the substrate holding unit 531 is positioned at the external position of the supercritical processing chamber 510, and a second supercritical processing liquid supply unit 57b that supplies the supercritical processing liquid G containing hydrofluoroolefin to the substrate W2 held by the substrate holding unit 531 when the substrate holding unit 531 is positioned at an inner position of the supercritical processing chamber 510. In the exemplary embodiment, the supercritical processing liquid G supplied by the first supercritical processing liquid supply unit 57a and the supercritical processing liquid G supplied by the second supercritical processing liquid supply unit 57b have the same composition. Accordingly, the hydrofluoroolefin contained in the supercritical processing liquid G supplied by the first supercritical processing liquid supply unit 57a and the hydrofluoroolefin contained in the supercritical processing liquid G supplied by the second supercritical processing liquid supply unit 57b are the same in kind. When the supercritical processing liquid G contains an organic solvent, the organic solvent contained in the supercritical processing liquid G supplied by the first supercritical processing liquid supply unit 57a and the organic solvent contained in the supercritical processing liquid G supplied by the second supercritical processing liquid supply unit 57b are the same in kind. In the exemplary embodiment in which the supercritical processing liquid G supplied by the first supercritical processing liquid supply unit 57a and the supercritical processing liquid G supplied by the second supercritical processing liquid supply unit 57b have the same composition, the liquid regenerated by a recycling unit 58 (to be described later) may be reused as the supercritical processing liquid G supplied by the first supercritical processing liquid supply unit 57a and/or the supercritical processing liquid G supplied by the second supercritical processing liquid supply unit 57b (in the exemplary embodiment, the supercritical processing liquid G supplied by the first supercritical processing liquid supply unit 57a and the supercritical processing liquid G supplied by the second supercritical processing liquid supply unit 57b), without fractionation by, for example, distillation.

The dry processing unit 5 may include only one of the first supercritical processing liquid supply unit 57a and the second supercritical processing liquid supply unit 57b. In the exemplary embodiment in which the dry processing unit 5 includes both of the first supercritical processing liquid supply unit 57a and the second supercritical processing liquid supply unit 57b, the position of the substrate holding unit 531 when the supercritical processing liquid G is supplied to the substrate W2 may be either the external position or the internal position of the supercritical processing chamber 510. However, in an exemplary embodiment in which the dry processing unit includes the first supercritical processing liquid supply unit 57a only, the position of the substrate holding unit 531 when the supercritical processing liquid G is supplied to the substrate W2 is the external position of the supercritical processing chamber 510. In an exemplary embodiment in which the dry processing unit 5 includes the second supercritical processing liquid supply unit 57b only, the position of the substrate holding unit 531 when the supercritical processing liquid G is supplied to the substrate W2 is the internal position of the supercritical processing chamber 510.

The first supercritical processing liquid supply unit 57a includes a supply pipe 571a that ejects the supercritical processing liquid G containing hydrofluoroolefin to the substrate W2 held by the substrate holding unit 531 when the substrate holding unit 531 is positioned at the external position of the supercritical processing chamber 510, and a reservoir 572a that stores the supercritical processing liquid G supplied to the supply pipe 571a. The supercritical processing liquid G is stored in a tank provided in the reservoir 572a. The supercritical processing liquid G is supplied to the supply pipe 571a from the reservoir 572a through a flow rate adjustor 573a (e.g., a valve).

The second supercritical processing liquid supply unit 57b includes a supply pipe 571b that ejects the supercritical processing liquid G containing hydrofluoroolefin to the substrate W2 held by the substrate holding unit 531 when the substrate holding unit 531 is positioned at the internal position of the supercritical processing chamber 510, and a reservoir 572b that stores the supercritical processing liquid G supplied to the supply pipe 571b. The supercritical processing liquid G is stored in a tank provided in the reservoir 572b. The supercritical processing liquid G is supplied to the supply pipe 571b from the reservoir 572a through a flow rate adjustor 573b (e.g., a valve).

In the exemplary embodiment, the second supercritical processing liquid supply unit 57b ejects the supercritical processing liquid G directly to the substrate W2 held by the substrate holding unit 531 when the substrate holding unit 531 is positioned at the internal position of the supercritical processing chamber 510, but the supply embodiment of the supercritical processing liquid G by the second supercritical processing liquid supply unit 57b is not limited to the exemplary embodiment. For example, when the substrate holding unit 531 is positioned at the internal position of the supercritical processing chamber 510, the second supercritical processing liquid supply unit 57b may not eject the supercritical processing liquid G directly to the substrate W2 held by the substrate holding unit 531, but eject the supercritical processing liquid G to the bottom portion of the chamber 510 or the bottom portion of the substrate holding unit 531 that supports the substrate W2. Further, in the exemplary embodiment, the supercritical processing liquid G supplied by the second supercritical processing liquid supply unit 57b is liquid, but the phase of the supercritical processing liquid G supplied from the second supercritical processing liquid supply unit 57b is not limited to that in the exemplary embodiment. For example, the supercritical processing liquid G supplied from the second supercritical processing liquid supply unit 57b may be in the form of a supercritical fluid or a subcritical fluid.

Olefin is an organic compound represented by $C_nH_{2n}$ (n is an integer of 2 or more), and has one double bond between C and C. Olefin is a class of unsaturated hydrocarbons and is also called alkene, ethylene-based hydrocarbon, or olefinic hydrocarbon. The carbon number of the olefin is not particularly limited as long as it is 2 or more, but preferably 2 to 10, and more preferably 3 to 6. Examples of olefin include $CH_3—CH=CH_2$ and $CH_3—CH=CH—CH_3$.

Hydrofluoroolefin (HFO) is a compound in which one or more hydrogen atoms of the olefin are substituted with fluorine atoms. The carbon number of the hydrofluoroolefin is not particularly limited, but is preferably 1 to 10, and more preferably 2 to 6. The hydrofluoroolefin may be either an E-form (trans form) or a Z-form (cis form). The hydrofluoroolefin may be hydrochlorofluoroolefin (HCFO). Hydrochlorofluoroolefin is a compound in which one or more hydrogen atoms of the olefin are substituted with fluorine atoms and one or more other hydrogen atoms of the olefin are substituted with chlorine atoms. The number of chlorine atoms in the hydrochlorofluoroolefin is not particularly limited, but is preferably 1 to 5, and more preferably 1 to 3. Examples of hydrofluoroolefins having no chlorine atom include $CF_3—CH=CH_2$, $CF_3—CF=CH_2$, $CHF_2—CH=CHF$, $CHF_2—CF=CH_2$, $CH_2F—CH=CF_2$, $CH_2F—CF=CHF$, $CH_3—CF=CF_2$, $CF_3—CH=CH—CF_3$, $CF_3—CH=CF—CH_3$, $CF_3—CF=CH—CH_3$, $CF_3—CH=CH—CH_2F$, $CHF_2—CF=CF—CH_3$, $CHF_2—CF=CH—CH_2F$, $CHF_2—CH=CF—CH_2F$, $CHF_2—CH=CH—CHF_2$, $CH_2F—CF=CF—CH_2F$, $CH_2F—CH=CH—CF_3$, $CH_2F—CF=CH—CHF_2$, $CF_3—CH_2—CF=CH_2$, $CF_3—CHF—CH=CH_2$, $CF_3—CH_2—CH=CHF$, $CHF_2—CF_2—CH=CH_2$, $CHF_2—CHF—CF=CH_2$, $CHF_2—CHF—CH=CHF$, $CH_2F—CF_2—CF=CH_2$, $CH_2F—CF_2—CH=CHF$, $CH_2F—CHF—CF=CHF$, $CH_2F—CHF—CH=CF_2$, $CH_2F—CH_2—CF=CF_2$, $CH_3—CF_2—CF=CHF$, and $CH_3—CF_2—CH=CF_2$. Examples of hydrofluoroolefins having chlorine atoms (i.e., hydrochlorofluoroolefin) include $CF_3—CH=CHCl$, $CHF_2—CF=CHCl$, $CHF_2—CH=CFCl$, $CHF_2—CCl=CHF$, $CH_2F—CCl=CF_2$, $CHFCl—CF=CHF$, $CH_2Cl—CF=CF_2$, and $CF_3—CCl=CH_2$. Examples of commercially available hydrofluoroolefin (including hydrochlorofluoroolefin) include HFO DR2 (boiling point: 33.4° C., critical temperature: 172° C., critical pressure: 2.9 MPa, GWP<10, IPA miscible) manufactured by Du Pont-Mitsui Fluorochemicals Co., Ltd., HFO DR12 (boiling point: 10° C., critical temperature: 138° C., critical pressure: 3.0 MPa, GWP 32) manufactured by Du Pont-Mitsui Fluorochemicals Co., Ltd., HFO OPTEON 1234yf (boiling point: −29° C., critical temperature: 95° C., critical pressure: 3.4 MPa, GWP 4) manufactured by Du Pont-Mitsui Fluorochemicals Co., Ltd, CCK-1105 (boiling point: 18.4° C., critical temperature: 167° C., critical pressure: 3.6 MPa, GWP 1, IPA miscible) manufactured by Central Glass Co., Ltd., and HCFO CGS-4 (boiling point: 39° C., critical temperature and pressure are higher than those of DR2, GWP 4, IPA miscible) manufactured by Central Glass Co., Ltd.

The hydrofluoroolefin contained in the supercritical processing liquid G may be miscible with the dry preventing liquid 1L3. The hydrofluoroolefin contained in the supercritical processing liquid G may have a critical temperature of 250° C. or less and a critical pressure of 10 MPa or less. In the hydrofluoroolefin contained in the supercritical processing liquid G, the amount of fluorine generated under supercritical processing conditions is 1 ppm or less. Examples of the hydrofluoroolefin which satisfies these conditions include 1-chloro-3,3,3-trifluoropropene ($CF_3—CH=CHCl$). 1-Chloro-3,3,3-trifluoropropene is miscible with alcohol such as, for example, IPA, and has a critical temperature of 167 ° C. and a critical pressure of 3.6 MPa. 1-Chloro-3,3,3-trifluoropropene is desirable in that its low global warming potential coefficient (GWP=1) does not require recovery of the exhaust gas and the waste liquid such as PFC, which is thus exhausted to the atmosphere as it is.

The supercritical processing liquid G may further contain, in addition to the hydrofluoroolefin, an organic solvent having a boiling point higher than that of the hydrofluoroolefin. When the supercritical processing liquid G contains such an organic solvent, the hydrofluoroolefin is less likely to evaporate from the supercritical processing liquid G as compared with a case where the organic solvent is not contained. Thus, when the supercritical processing liquid G is supplied to the substrate W2, collapse of the concavoconvex pattern of the substrate W2 due to evaporation of the hydrofluoroolefin may be prevented. Examples of the organic solvent contained in the supercritical processing liquid G include alcohol such as, for example, isopropyl alcohol. The amount of the organic solvent contained in the supercritical processing liquid G may be set to the extent that the supercritical processing liquid G becomes nonflammable under the supercritical processing conditions. The volume ratio (organic solvent: hydrofluoroolefin) of the organic solvent and the hydrofluoroolefin in the supercritical processing liquid G is preferably 1:100 to 1:1, and more preferably 1:10 to 1:3. The organic solvent contained in the supercritical processing liquid G and the organic solvent contained in the dry preventing liquid 1L3 may be the same in kind. When the organic solvent contained in the supercritical processing liquid G and the organic solvent contained in the dry preventing liquid 1L3 may be the same in kind, the liquid regenerated by a recycling unit 58 (to be described later) may be reused as the supercritical processing liquid G without fractionation by, for example, distillation.

The dry processing unit 5 includes a discharge unit 54 that discharges the fluid in the supercritical processing chamber 510. The discharge unit 54 includes a discharge line 541 that discharges the fluid in the supercritical processing chamber 510, and a flow rate adjustor 542 (e.g., a valve) interposed in the discharge line 541. The flow rate adjustor 542 (e.g., a valve) adjusts the discharge amount of the fluid such that the inside of the supercritical processing chamber 510 is adjusted to a predetermined pressure.

The dry processing unit 5 includes a recycling unit 58 that regenerates a liquid R from a gas evaporated from the supercritical processing liquid G supplied to the substrate W2 held by the substrate holding unit 531 when the substrate holding unit 531 is positioned at the external position of the supercritical processing chamber 510, and a fluid discharged from the discharge unit 54, and supplies the regenerated liquid R to the reservoir 572a of the first supercritical processing liquid supply unit 57a and/or the reservoir 572b of the second supercritical processing liquid supply unit 57b (in the exemplary embodiment, the reservoir 572a of the first supercritical processing liquid supply unit 57a and the reservoir 572b of the second supercritical processing liquid supply unit 57b).

The recycling unit 58 includes a discharge line 581 that discharges the fluid in the dry processing chamber 500, a flow rate adjustor 582 (e.g., a valve) interposed in the discharge line 581, a liquid regenerator 583 connected to the discharge line 581 and the discharge line 541 of the discharge unit 54, a supply line 584 that supplies the liquid R, which is regenerated from the liquid regenerator 583, to the reservoir 572a of the first supercritical processing liquid supply unit 57a, a flow rate adjustor 585 (e.g., a valve) interposed in the supply line 584, a supply line 586 that supplies the liquid R, which is regenerated from the liquid regenerator 583, to the reservoir 572b of the second supercritical processing liquid supply unit 57b, and a flow rate adjustor 587 (e.g., a valve) interposed in the supply line 586. The liquid regenerator 583 produces the liquid R, for example, by cooling the gas and/or the fluid supplied through the discharge line 581 and the discharge line 541 of the discharge unit 54. For example, room temperature cooling water is used for the cooling. The liquid R regenerated by the liquid regenerator 583 contains hydrofluoroolefin of the same kind as that contained in the supercritical processing liquid G (when the supercritical processing liquid G contains hydrofluoroolefin and an organic solvent, hydrofluoroolefin and an organic solvent of the same kind as those contained in the supercritical processing liquid G).

The reservoir 572a of the first supercritical processing liquid supply unit 57a is connected with a circulation pipe line 577a in which a pump 574a, a concentration measuring unit 575a, and a cooling unit 576a are interposed. When the supercritical processing liquid G stored in the reservoir 572a is circulated through the circulation pipe line 577a, the cooling unit 576a cools the supercritical processing liquid G to a temperature (e.g., 10° C.) lower than the boiling point of the hydrofluoroolefin contained in the supercritical processing liquid G This makes it difficult for the hydrofluoroolefin to evaporate from the supercritical processing liquid G. Therefore, when the supercritical processing liquid G is supplied to the substrate W2, collapse of the concavo-convex pattern of the substrate W2 due to evaporation of the hydrofluoroolefin may be prevented. When the supercritical processing liquid G stored in the reservoir 572a is circulated through the circulation pipe line 577a, the concentration measuring unit 575a measures the concentration of the hydrofluoroolefin in the supercritical processing liquid G. When the supercritical processing liquid G contains an organic solvent (e.g., alcohol such as, for example, isopropyl alcohol) in addition to the hydrofluoroolefin, the concentration measuring unit 575a also measures the concentration of the organic solvent in the supercritical processing liquid G in addition to the concentration of the hydrofluoroolefin in the supercritical processing liquid G. The concentration measuring method of the concentration measuring unit 575a is performed, for example, in a specific gravity manner. For example, when the hydrofluoroolefin is 1-chloro-3,3,3-trifluoropropene, its specific gravity is larger than that of water. When the organic solvent is isoproyl alcohol, its specific gravity is smaller than that of water. Therefore, the concentrations of both may be measured by specific gravity.

The reservoir 572b of the second supercritical processing liquid supply unit 57b is connected with a circulation pipe line 577b in which a pump 574b, a concentration measuring unit 575b, and a cooling unit 576b are interposed. When the supercritical processing liquid G stored in the reservoir 572b is circulated through the circulation pipe line 577b, the cooling unit 576b cools the supercritical processing liquid G to a temperature (e.g., 10° C.) lower than the boiling point of the hydrofluoroolefin contained in the supercritical processing liquid G This makes it difficult for the hydrofluoroolefin to evaporate from the supercritical processing liquid G. Therefore, when the supercritical processing liquid G is supplied to the substrate W2, collapse of the concavo-convex pattern of the substrate W2 due to evaporation of the hydrofluoroolefin may be prevented. When the supercritical processing liquid G stored in the reservoir 572b is circulated through the circulation pipe line 577b, the concentration measuring unit 575b measures the concentration of the hydrofluoroolefin in the supercritical processing liquid G. When the supercritical processing liquid G contains an organic solvent (e.g., alcohol such as, for example, isopropyl alcohol) in addition to the hydrofluoroolefin, the concentration measuring unit 575b also measures the concentration of the organic solvent in the supercritical processing liquid G in addition to the concentration of the hydrofluoroolefin in the supercritical processing liquid G. The concentration measuring method of the concentration measuring unit 575b is performed, for example, in a specific gravity manner.

The dry processing unit 5 includes a concentration adjusting unit 59 that adjusts the concentration of the supercritical processing liquid G stored in the reservoirs 572a and 572b. The concentration adjusting unit 59 adjusts the concentration of the supercritical processing liquid G stored in the reservoir 572a by supplying a stock liquid H of the supercritical processing liquid G from a reservoir 591 storing the stock liquid H to the reservoir 572a through a supply pipe line 593 in which a flow rate regulator 592 (e.g., a valve) is interposed. In addition, the concentration adjusting unit 59 adjusts the concentration of the supercritical processing liquid G stored in the reservoir 572b by supplying the stock liquid H of the supercritical processing liquid G from the reservoir 591 storing the stock liquid H to the reservoir 572b through a supply pipe line 595 in which a flow rate regulator 594 (e.g., a valve) is interposed. In the reservoirs 572a and 572b, the stock liquid H supplied from the concentration adjusting unit 59 and the liquid R supplied from the recycling unit 58 are mixed to prepare a new supercritical processing liquid G At this time, in order to adjust the concentration of the supercritical processing liquid G stored in the reservoir 572a to a predetermined concentration, the controller 3 causes the flow rate adjustor 592 to adjust the flow rate of the stock liquid H and causes the flow rate adjustor 585 to adjust the flow rate of the liquid R, based on the hydrofluoroolefin concentration (the hydrofluoroolefin concentration and the organic solvent concentration in the case where the supercritical processing liquid G contains an organic solvent in addition to the hydrofluoroolefin) measured by the concentration measuring unit 575a. In addition, in order to adjust the concentration of the supercritical processing liquid G stored in the reservoir 572b to a predetermined concentration, the controller 3 causes the flow rate adjustor 594 to adjust the flow rate of the stock liquid H and causes the flow rate adjustor 587 to adjust the flow rate of the liquid R, based on the hydrofluoroolefin concentration (the hydrofluoroolefin concentration and the organic solvent concentration in the case where the supercritical processing liquid G contains an organic solvent in addition to the hydrofluoroolefin) measured by the concentration measuring unit 575b.

<Configuration 02 of Dry Processing Unit>

Next, a specific configuration of the dry processing unit 5 will be described with reference to FIGS. 4 and 5. FIG. 4 is a schematic perspective view illustrating a configuration of the dry processing unit 5, and FIG. 5 is a schematic cross-sectional view illustrating the configuration of the dry processing unit 5.

The dry processing unit 5 performs a dry processing on the substrate W2 which have been subjected to a substrate processing by the cleaning processing unit 4. The substrate W2 which have been subjected to a substrate processing by the cleaning processing unit 4 is in a wet state by a dry preventing liquid (e.g., a mixed liquid of the first dry preventing liquid 2L3 and the second dry preventing liquid 2L4) filled on the surface thereof. The substrate processing performed by the dry processing unit 5 is not particularly limited as long as the dry processing is included. Therefore, the processing performed by the dry processing unit 5 may include processings other than the dry processing.

The dry processing unit 5 includes a chamber 510, and performs the substrate processing including the dry processing in the chamber 510.

The chamber 510 includes an inner space 511 and an opening 512 leading to the inner space 511. The inner space 511 and the opening 512 are defined by the wall portion of the chamber 510. The chamber 510 is configured to seal the inner space 511 by sealing the opening 512. The inner space 511 is a space capable of accommodating the substrate W2. In the exemplary embodiment, since the substrate W2 is accommodated in the inner space 511 in a state of being held by a substrate holding portion 531, the inner space 511 is a space capable of accommodating the substrate holding unit 531 that holds the substrate W2. The size of the inner space 511 is, for example, about 200 to 10,000 cm$^3$. The carry-in/out of the substrate W2 into/from the internal space 511 is performed through the opening 512.

The chamber 510 includes a pressure-resistant container. Examples of the pressure-resistant container include a pressure-resistant container made of a material having a high pressure resistance but a relatively low thermal conductivity such as, for example, stainless steel, carbon steel, titanium, Hastelloy (registered trademark), or Inconel (registered trademark). An inner container made of a material having higher thermal conductivity than that of the pressure-resistant container (e.g., aluminum, copper, aluminum nitride, or silicon carbide) is provided inside the pressure-resistant container in a nested structure. The internal container may be heated. A thermal insulation layer made of, for example, quartz or alumina is provided between the pressure-resistant container and the inner container, and only the inner container is heated, so that the thermal responsiveness of the chamber 510 may be improved, and energy consumption may be reduced.

The dry processing unit 5 includes the substrate holding unit 531 that holds the substrate W2. The substrate holding unit 531 is configured to hold the substrate W2 transversely in a state of being immersed in a liquid (e.g., liquid dialkyl ether G supplied from a first dialkyl ether supply unit 57a and/or a second dialkyl ether supply unit 57b).

The dry processing unit 5 includes a cover member 532 provided in the substrate holding unit 531. The cover member 532 is configured to seal the opening 512 of the chamber 510 when the substrate holding unit 531 is accommodated in the inner space 511 of the chamber 510.

The dry processing unit 5 includes a transfer mechanism 56 that enables the substrate holding unit 531 to move between an external position of the chamber 510 (a position where the substrate W2 is delivered to and from the substrate holding unit 531) and an internal position of the chamber 510 (a position where the dry processing is performed on the substrate W2 held by the substrate holding unit 531). The transfer mechanism 56 is a slide mechanism including a rail 561 extending in a movement direction of the substrate holding unit 531 and a slider 562 with a built-in driving mechanism that travels on the rail 561, and is provided on both sides of the substrate holding unit 531. The slider 562 is connected to the cover member 532. Therefore, as the slider 562 moves along the rail 561, the cover member 532 and the substrate holding unit 531 connected to the cover member 532 also move along the rail 561. Specifically, when the slider 562 moves to one end portion of the rail 561, the substrate holding unit 531 may move to the external position of the chamber 510. When the slider 562 moves to the other end portion of the rail 561, the substrate holding unit 531 may move to the internal position of the chamber 10.

The dry processing unit 5 includes a heating unit 52 that heats the inside of the chamber 510. The heating unit 52 is a heater made of, for example, a heating resistor, and is provided in the wall portion of the chamber 510. The heating unit 52 may heat the substrate W2 in chamber 510 through heating of the inside of the chamber 510. The heating unit 52 may change the heat generation amount by a power supplied from a power supply unit 521, and may increase the temperature in the chamber 510 according to a predetermined heating schedule, based on, for example, a temperature detection result acquired from a temperature detection unit 522 or a pressure detection result of a pressure detection unit 513.

The dry processing unit 5 includes a first dialkyl ether supply unit 57a that supplies a liquid dialkyl ether G represented by $R^1$—O—$R^2$ (wherein $R^1$ and $R^2$ represent the same or different alkyl groups) to the substrate W2 held by the substrate holding unit 531 when the substrate holding unit 531 is positioned at the external position of the chamber 510, and a second dialkyl ether supply unit 57b that supplies the liquid dialkyl ether G to the substrate W2 held by the substrate holding unit 531 when the substrate holding unit 531 is positioned at the inner position of the chamber 510. The liquid dialkyl ether G supplied by the first dialkyl ether supply unit 57a and the liquid dialkyl ether G supplied by the second dialkyl ether supply unit 57b may be the same as or different from each other. However, in the exemplary embodiment, they are the same.

The dry processing unit 5 may include only one of the first dialkyl ether supply unit 57a and the second dialkyl ether supply unit 57b. In the exemplary embodiment in which the dry processing unit 5 includes both of the first dialkyl ether supply unit 57a and the second dialkyl ether supply unit 57b, the position of the substrate holding unit 531 when the liquid dialkyl ether G is supplied to the substrate W2 may be either the external position of the chamber 510 or the internal position of the chamber 510. However, in an exemplary embodiment in which the dry processing unit includes the first dialkyl ether supply unit 57a only, the position of the substrate holding unit 531 when the liquid dialkyl ether G is supplied to the substrate W2 is the external position of the chamber 510. In an exemplary embodiment in which the dry processing unit 5 includes the second dialkyl ether supply unit 57b only, the position of the substrate holding unit 531 when the liquid dialkyl ether G is supplied to the substrate W2 is the internal position of the chamber 510.

The first dialkyl ether supply unit 57a includes a dialkyl ether supply pipe 571a that ejects the liquid dialkyl ether G to the substrate W2 held by the substrate holding unit 531 when the substrate holding unit 531 is positioned at the external position of the chamber 510, and a dialkyl ether source 572a that supplies the liquid dialkyl ether G to the dialkyl ether supply pipe 571a. The liquid dialkyl ether G is stored in a tank provided in the dialkyl ether source 572a. The liquid dialkyl ether G is supplied to the dialkyl ether supply pipe 571a from the dialkyl ether source 572a through a flow rate adjustor 573a (e.g., a valve).

The second dialkyl ether supply unit 57b includes a dialkyl ether supply pipe 571b that ejects the liquid dialkyl ether G to the substrate W2 held by the substrate holding unit 531 when the substrate holding unit 531 is positioned at the external position of the chamber 510, and a dialkyl ether source 572b that supplies the liquid dialkyl ether G to the dialkyl ether supply pipe 571b. The liquid dialkyl ether G is stored in a tank provided in the dialkyl ether source 572b. The liquid dialkyl ether G is supplied to the dialkyl ether supply pipe 571b from the dialkyl ether source 572b through a flow rate adjustor 573b (e.g., a valve).

In the exemplary embodiment, the second dialkyl ether supply unit 57b ejects the liquid dialkyl ether G directly to the substrate W2 held by the substrate holding unit 531 when the substrate holding unit 531 is positioned at the internal position of the chamber 510, but the supply embodiment of the liquid dialkyl ether G by the second dialkyl ether supply unit 57b is not limited to the exemplary embodiment. For example, when the substrate holding unit 531 is positioned at the internal position of the chamber 510, the second dialkyl ether supply unit 57b may not eject the liquid dialkyl ether G directly to the substrate W2 held by the substrate holding unit 531, but eject the liquid dialkyl ether G to the bottom portion of the chamber 510 or the bottom portion of the substrate holding unit 531 that supports the substrate W2. Further, in the exemplary embodiment, the dialkyl ether G supplied by the second dialkyl ether supply unit 57b is liquid, but the phase of the dialkyl ether G supplied from the second dialkyl ether supply unit 57b is not limited to that in the exemplary embodiment. For example, the dialkyl ether G supplied from the second dialkyl ether supply unit 57b may be in the form of a supercritical fluid or a subcritical fluid.

Examples of the alkyl group represented by $R^1$ or $R^2$ include a linear or branched alkyl group having 1 to 8 carbon atoms such as, for example, a methyl group, an ethyl group, an n-propyl group, an isopropyl group, an n-butyl group, an isobutyl group, a s-butyl group, a t-butyl group, a pentyl group, a hexyl group, a heptyl group, and an octyl group. The carbon number of the alkyl group represented by $R^1$ or $R^2$ is not particularly limited, but is preferably 1 to 5, and more preferably 1 to 4.

The liquid dialkyl ether G is a liquid at normal temperature and pressure. The liquid dialkyl ether G is miscible with the first dry preventing liquid 2L3 and the second dry preventing liquid 2L4, and may have a boiling point of 50° C. or more, a critical temperature of 250° C. or more, and a critical pressure of 10 MPa or less. Examples of the dialkyl ether that satisfies these conditions include methyl tert-butyl ether (MTBE) and diisopropyl ether (DIPE). MTBE is miscible with IPA and PGMEA, and has a boiling point of 55° C., a critical temperature of 224° C., and a critical pressure of 3.4 MPa. DIPE is miscible with IPA and PGMEA, and has a boiling point of 69° C., a critical temperature of 227° C., and a critical pressure of 2.9 MPa. MTBE is desirable in that its low global warming potential coefficient (GWP=1) does not require recovery of the exhaust gas and the waste liquid such as PFC.

The dry processing unit 5 includes a discharge unit 54 that discharges the fluid in the chamber 510. The discharge unit 54 includes a discharge line 541 that discharges the fluid in the chamber 510, and a flow rate adjustor 542 (e.g., a valve) interposed in the discharge line 541. The flow rate adjustor 542 (e.g., a valve) adjusts the discharge amount of the fluid such that the inside of the chamber 510 is adjusted to a predetermined pressure.

[First Substrate Processing Method]

Hereinafter, descriptions will be made on a substrate processing method performed by the substrate processing apparatus 1. The substrate processing method performed by the substrate processing apparatus 1 includes a cleaning step of cleaning the substrate W1 and a dry step of drying the substrate W2 after the cleaning step. The cleaning step is performed by the cleaning processing unit 4, and the dry step is performed by the dry processing unit 5. The operation of the cleaning processing unit 4 and the operation of the dry processing unit 5 are controlled by the controller 3.

<Step of Carrying Substrate into Cleaning Processing Unit>

First, the substrate W1 is carried into the cleaning processing unit 4. At this time, the conveyance mechanism 213 takes out the substrate W1 from the carrier C placed on the placing unit 211, and places the taken-out substrate W1 on the delivery section 214. The conveyance mechanism 222 takes out the substrate W1 placed on the delivery unit 214, and carries the taken-out substrate W1 into the cleaning processing unit 4.

The substrate processing apparatus 1 holds the substrate W1, which has been carried into the cleaning processing unit 4, by the holding unit 42. At this time, the substrate holding unit 42 horizontally holds the substrate W1 on the turntable 422 in a state where the outer edge portion of the substrate W1 is supported by the chuck 423. The driving unit 424 rotates the substrate W1 held by the substrate holding unit 42 at a predetermined speed. The controller 3 controls the operation of the driving unit 424 to control, for example, the rotation timing and rotation speed of the substrate W1.

<Cleaning Step>

Subsequently, a cleaning step by the cleaning processing unit 4 is performed on the substrate W1 held by the substrate holding unit 42.

In the cleaning step, the nozzle 1431a of the cleaning liquid supply unit 1043a is positioned above the center of the substrate W1 while the substrate W1 held by the substrate holding unit 42 is rotated at a predetermined speed, and the cleaning liquid 1L1 is supplied from the nozzle 1431a to the substrate W1. At this time, the controller 3 controls the operation of the cleaning liquid supply unit 1043a to control the supply timing, the supply time, and the supply amount of the cleaning liquid 1L1. The cleaning liquid 1L1 supplied to the substrate W1 is diffused over the substrate W1 by the centrifugal force accompanying the rotation of the substrate W1. As a result, deposits attached to the substrate W1 are removed from the substrate W1.

<Rinse Step>

After the cleaning step, a rinse step by the cleaning processing unit 4 is performed on the substrate W1 held by the substrate holding unit 42.

In the rinse step, the nozzle 1431b of the rinse liquid supply unit 1043b is positioned above the center of the substrate W1 while the substrate W1 held by the substrate holding unit 42 is rotated at a predetermined speed, and the rinse liquid 1L2 is supplied from the nozzle 1431b to the substrate W1. At this time, the controller 3 controls the operation of the rinse liquid supply unit 1043b to control the supply timing, the supply time, and the supply amount of the rinse liquid 1L2. The rinse liquid 1L2 supplied to the substrate W1 is diffused over the substrate W1 by the centrifugal force accompanying the rotation of the substrate W1. As a result, the cleaning liquid 1L1 remaining on the substrate W1 is washed out.

<Dry Preventing Liquid Supply Step>

After the rinse step, a dry preventing liquid supply step by the cleaning processing unit 4 is performed on the substrate W1 held by the substrate holding unit 42.

In the dry preventing liquid supply step, the nozzle 1431c of the dry preventing liquid supply unit 1043c is positioned above the center of the substrate W1 while the substrate W1 held by the substrate holding unit 42 is rotated at a predetermined speed, or while the substrate W1 held by the substrate holding unit 42 is maintained in a stopped state, and a dry preventing liquid 1L3 is supplied from the nozzle 1431c to the substrate W1. At this time, the controller 3 controls the operation of the dry preventing liquid supply unit 1043c to control the supply timing, the supply time, and the supply amount of the dry preventing liquid 1L3. In the dry preventing supply step, the rinse liquid 1L2 remaining on the substrate W1 is replaced with the dry preventing liquid 1L3. The dry preventing liquid 1L3 filled on the substrate W1 functions as a dry preventing liquid to suppress occurrence of pattern collapse due to the drying of the surface of the substrate during the conveyance of the substrate from the cleaning processing unit 4 to the dry processing unit 5 and the carry of the substrate into the dry processing unit 5.

<Step of Carrying Substrate into Dry Processing Unit>

The substrate W2 which have been subjected to a substrate processing by the cleaning processing unit 4 is in a wet state by the dry preventing liquid 1L3 filled on the surface thereof. While maintaining the wet state, the substrate W2 is carried out from the cleaning processing unit 4 and carried into the dry processing unit 5. At this time, the conveyance mechanism 222 takes out the substrate W2 from the cleaning processing unit 4, and carries the taken-out substrate W2 into the dry processing chamber 500 in the dry processing unit 5. The conveyance mechanism 222 may have, for example, a cooling mechanism or a cover mechanism to suppress vaporization (evaporation) of the dry preventing liquid 1L3 filled on the surface of the substrate W2 from the substrate W2 during the conveyance.

The substrate W2 carried into the dry processing chamber 500 of the dry processing unit 5 is held by the substrate holding unit 531 waiting at the external position of the supercritical processing chamber 510. At this time, the power supply unit 521 is OFF, and the internal space 511 of the supercritical processing chamber 510 is at a temperature equal to or lower than the critical temperature of the supercritical processing liquid G and atmospheric pressure. An inert gas (e.g., $N_2$ gas) is purged into the internal space 511 of the supercritical processing chamber 510 to keep the inside of the supercritical processing chamber 510 in a low oxygen atmosphere, and heating in the supercritical processing chamber 510 is started by the heating unit 52. Then, it is desirable that a combustible gas (e.g., IPA) is not brought into contact with a relatively high concentration of oxygen under a high temperature atmosphere.

<Supercritical Processing Liquid Supply Step>

When the substrate holding unit 531 holding the substrate W2 is positioned at the external position of the supercritical processing chamber 510 (i.e., before the substrate W2 is accommodated in the supercritical processing chamber 510), the first supercritical processing liquid supply unit 57a supplies the supercritical processing liquid G to the substrate W2 held by the substrate holding unit 531. The first supercritical processing liquid supply unit 57a supplies the supercritical processing liquid G, for example, until the substrate W2 held by the substrate holding unit 531 is immersed in the supercritical processing liquid G, or until the supercritical processing liquid G is filled on the surface of the substrate W2 held by the substrate holding unit 531.

<Dry Step>

After the supercritical processing liquid G is supplied to the substrate W2, the substrate holding unit 531 is moved from the external position of the supercritical processing chamber 510 to the internal position of the supercritical processing chamber 510 through the opening 512 of the supercritical processing chamber 510 such that the substrate W2 is accommodated in the supercritical processing chamber 510 while being held by the substrate holding unit 531. When the substrate holding unit 531 is moved to the internal position of the supercritical processing chamber 510, the opening 512 is sealed by the cover member 532, so that the inside of the supercritical processing chamber 510 is closed.

When the substrate holding unit 531 holding the substrate W2 is positioned at the internal position of the supercritical processing chamber 510, the second supercritical processing liquid supply unit 57b may supply the supercritical processing liquid G to the substrate W2 held by the substrate holding unit 531 as necessary (for example, in order to compensate for the volatilization reduction of the supercritical processing liquid G supplied from the first supercritical processing liquid supply unit 57a).

After the substrate holding unit 531 holding the substrate W2 is accommodated in the supercritical processing chamber 510 (in the case where the supercritical processing liquid G is supplied to the substrate W2 held by the substrate holding unit 531, by the second supercritical processing liquid supply unit 57b, after the supply thereof), the inside of the supercritical processing chamber 510 is heated by the heating unit 52. Specifically, power supply from the power supply unit 521 to the heating unit 52 is started, and the inside of the supercritical processing chamber 510 is heated by the heating unit 52. At this time, since the inside of the supercritical processing chamber 510 is pressurized by the vapor pressure of the supercritical processing liquid G, the supercritical processing liquid G is heated along the vapor pressure curve while being maintained in the liquid state. Further, a part of the supercritical processing liquid G is vaporized so that the pressure inside the supercritical processing chamber 510 is increased.

When the temperature-pressure state of the supercritical processing chamber 510 comes close to the critical point (critical temperature Tc and critical pressure Pc) of the supercritical processing liquid G, the supercritical processing liquid G is changed into a subcritical fluid. When the temperature-pressure state of the supercritical processing chamber 510 exceeds the critical point (critical temperature Tc and critical pressure Pc) of the supercritical processing liquid G, the supercritical processing liquid G is changed into a supercritical fluid. In practice, the atmosphere in the supercritical processing chamber 510 is in a state where the dry preventing liquid 1L3 is mixed with a fluid such as, for example, air flowing from the outside. However, when the supercritical processing liquid G is in a supercritical state or subcritical state, the liquid is dissolved so that no liquid surface is present inside the pattern. Therefore, when the critical processing liquid G comes into the supercritical state or subcritical state, the liquid on the surface may be removed from the substrate W2 without causing pattern collapse.

Thus, after the lapse of time sufficient for the supercritical processing liquid G in the supercritical processing chamber 510 to be changed into the supercritical fluid or subcritical fluid, the flow rate adjustor 542 (e.g., a valve) of the discharge line 541 is opened to discharge the fluid in the supercritical processing chamber 510. When the pressure inside the supercritical processing chamber 510 becomes equal to or lower than the critical pressure of the supercritical processing liquid G, the supercritical processing liquid G undergoes a phase change from the supercritical or subcritical fluid to a gas. At this time, when the temperature of the supercritical processing chamber 510 is adjusted to a temperature (e.g., 250° C.) equal to or higher than the boiling point of the hydrofluoroolefin, it is possible to discharge the fluid inside the supercritical processing chamber 510 from the supercritical processing chamber 510 in a state of a supercritical or subcritical fluid or a gas while suppressing reliquefaction of the hydrofluoroolefin. As a result, in the supercritical processing chamber 510 which is depressurized to the atmospheric pressure, it is possible to obtain a dried substrate W3 from which the liquid has been removed from the surface thereof.

<Step of Carrying Substrate out from Dry Processing Unit>

After the dry step, the substrate W3 is carried out from the dry processing unit 5. At this time, the conveyance mechanism 222 takes out the substrate W3 from the dry processing unit 5 and places the taken-out substrate W3 on the delivery unit 214. The conveyance mechanism 213 takes out the substrate W3 placed on the delivery unit 214 and stores the substrate W3 in the carrier C of the placing unit 211.

<Liquid Regeneration Step>

When the substrate holding unit 531 holding the substrate W2 is positioned at the external position of the supercritical processing chamber 510 (i.e., before the substrate W2 is accommodated in the supercritical processing chamber 510), the fluid in the dry processing chamber 500 is discharged through the discharge line 581 of the recycling unit 58 when or after the first supercritical processing liquid supply unit 57a supplies the supercritical processing liquid G to the substrate W2 held by the substrate holding unit 531. Therefore, when the substrate holding unit 531 is positioned at the external position of the supercritical processing chamber 510, the gas vaporized from the supercritical processing liquid G supplied to the substrate W2 held by the substrate holding unit 531 is supplied to the liquid regenerator 583. The amount of the gas to be supplied to the liquid regenerator 583 is adjusted by the flow rate adjustor 582 (e.g., a valve) interposed in the discharge line 581. The liquid regenerator 583 regenerates a liquid (R) from the supplied gas. The regenerated liquid (R) is supplied to the reservoir(s) 572a and/or 572b together with the liquid (R) regenerated from the fluid discharged from the discharge unit 54.

The fluid discharged by the discharge unit 54 is supplied to the liquid regenerator 583 of the recycling unit 58 through the discharge line 541. The amount of the gas to be supplied to the liquid regenerator 583 is adjusted by the flow rate adjustor 542 (e.g., a valve) interposed in the discharge line 541. The liquid regenerator 583 regenerates a liquid (R) from the supplied fluid. The regenerated liquid (R) is supplied to the reservoir(s) 572a and/or 572b together with the liquid (R) regenerated from the gas discharged from the dry processing chamber 500.

<Supercritical Processing Liquid Concentration Adjustment Step>

After the regenerated liquid (R) is supplied to the reservoir(s) 572a and/or 572b, the concentration of the supercritical processing liquid G stored in the reservoir(s) 572a and/or 572b is adjusted by the concentration adjusting unit 59. Specifically the concentration adjusting unit 59 adjusts the concentration of the supercritical processing liquid G stored in the reservoir 572a by supplying a stock liquid H of the supercritical processing liquid G from a reservoir 591 storing the stock liquid H to the reservoir 572a through a supply pipe line 593 in which a flow rate regulator 592 (e.g., a valve) is interposed. In addition, the concentration adjusting unit 59 adjusts the concentration of the supercritical processing liquid G stored in the reservoir 572b by supplying the stock liquid H of the supercritical processing liquid G from the reservoir 591 storing the stock liquid H to the reservoir 572b through a supply pipe line 595 in which a flow rate regulator 594 (e.g., a valve) is interposed. In the reservoirs 572a and 572b, the stock liquid H supplied from the concentration adjusting unit 59 and the liquid R supplied from the recycling unit 58 are mixed to prepare a new supercritical processing liquid G. At this time, in order to adjust the concentration of the supercritical processing liquid G stored in the reservoir 572a to a predetermined concentration, the controller 3 causes the flow rate adjustor 592 to adjust the flow rate of the stock liquid H and causes the flow rate adjustor 585 to adjust the flow rate of the liquid R, based on the hydrofluoroolefin concentration (the hydrofluoroolefin concentration and the organic solvent concentration in the case where the supercritical processing liquid G contains an organic solvent in addition to the hydrofluoroolefin) measured by the concentration measuring unit 575a. In addition, in order to adjust the concentration of the supercritical processing liquid G stored in the reservoir 572b to a predetermined concentration, the controller 3 causes the flow rate adjustor 594 to adjust the flow rate of the stock liquid H and causes the flow rate adjustor 587 to adjust the flow rate of the liquid R, based on the hydrofluoroolefin concentration (the hydrofluoroolefin concentration and the organic solvent concentration in the case where the supercritical processing liquid G contains an organic solvent in addition to the hydrofluoroolefin) measured by the concentration measuring unit 575b.

[Second Substrate Processing Method]

Hereinafter, descriptions will be made on a substrate processing method performed by the substrate processing apparatus 1. The substrate processing method performed by the substrate processing apparatus 1 includes a cleaning step of cleaning the substrate W1 and a dry step of drying the substrate W2 after the cleaning step. The cleaning step is performed by the cleaning processing unit 4, and the dry step is performed by the dry processing unit 5. The operation of the cleaning processing unit 4 and the operation of the dry processing unit 5 are controlled by the controller 3.

<Step of Carrying Substrate into Cleaning Processing Unit>

First, the substrate W1 is carried into the cleaning processing unit 4. At this time, the conveyance mechanism 213 takes out the substrate W1 from the carrier C placed on the placing unit 211, and places the taken-out substrate W1 on the delivery section 214. The conveyance mechanism 222 takes out the substrate W1 placed on the delivery unit 214, and carries the taken-out substrate W1 into the cleaning processing unit 4.

The substrate processing apparatus 1 holds the substrate W1, which has been carried into the cleaning processing unit 4, by the holding unit 42. At this time, the substrate holding unit 42 horizontally holds the substrate W1 on the turntable 422 in a state where the outer edge portion of the substrate W1 is supported by the chuck 423. The driving unit 424 rotates the substrate W1 held by the substrate holding unit 42 at a predetermined speed. The controller 3 controls the operation of the driving unit 424 to control, for example, the rotation timing and rotation speed of the substrate W1.

<Cleaning Step>

Subsequently, a cleaning step by the cleaning processing unit 4 is performed on the substrate W1 held by the substrate holding unit 42.

In the cleaning step, the nozzle 2431*a* of the cleaning liquid supply unit 2043*a* is positioned above the center of the substrate W1 while the substrate W1 held by the substrate holding unit 42 is rotated at a predetermined speed, and the cleaning liquid 2L1 is supplied from the nozzle 2431*a* to the substrate W1. At this time, the controller 3 controls the operation of the cleaning liquid supply unit 2043*a* to control the supply timing, the supply time, and the supply amount of the cleaning liquid 2L1. The cleaning liquid 2L1 supplied to the substrate W1 is diffused over the substrate W1 by the centrifugal force accompanying the rotation of the substrate W1. As a result, deposits attached to the substrate W1 are removed from the substrate W1.

<Rinse Step>

After the cleaning step, a rinse step by the cleaning processing unit 4 is performed on the substrate W1 held by the substrate holding unit 42.

In the rinse step, the nozzle 2431*b* of the rinse liquid supply unit 2043*b* is positioned above the center of the substrate W1 while the substrate W1 held by the substrate holding unit 42 is rotated at a predetermined speed, and the rinse liquid 2L2 is supplied from the nozzle 2431*b* to the substrate W1. At this time, the controller 3 controls the operation of the rinse liquid supply unit 2043*b* to control the supply timing, the supply time, and the supply amount of the rinse liquid 2L2. The rinse liquid 2L2 supplied to the substrate W1 is diffused over the substrate W1 by the centrifugal force accompanying the rotation of the substrate W1. As a result, the cleaning liquid 2L1 remaining on the substrate W1 is washed out.

<First Dry Preventing Liquid Supply Step>

After the rinse step, a first dry preventing liquid supply step by the cleaning processing unit 4 is performed on the substrate W1 held by the substrate holding unit 42.

In the first dry preventing liquid supply step, the nozzle 2431*c* of the first dry preventing liquid supply unit 2043*c* is positioned above the center of the substrate W1 while the substrate W1 held by the substrate holding unit 42 is rotated at a predetermined speed, or while the substrate W1 held by the substrate holding unit 42 is maintained in a stopped state, and a first dry preventing liquid 2L3 is supplied from the nozzle 2431*c* to the substrate W1. At this time, the controller 3 controls the operation of the first dry preventing liquid supply unit 2043*c* to control the supply timing, the supply time, and the supply amount of the first dry preventing liquid 2L3. In the first dry preventing supply step, the rinse liquid 2L2 remaining on the substrate W1 is replaced with the first dry preventing liquid 2L3. The first dry preventing liquid 2L3 filled on the substrate W1 functions as a dry preventing liquid to suppress occurrence of pattern collapse due to the drying of the surface of the substrate during the conveyance of the substrate from the cleaning processing unit 4 to the dry processing unit 5 and the carry of the substrate into the dry processing unit 5.

<Second Dry Preventing Liquid Supply Step>

After the first dry preventing liquid supply step, a second dry preventing liquid supply step by the cleaning processing unit 4 is performed on the substrate W1 held by the substrate holding unit 42.

In the second dry preventing liquid supply step, the nozzle 2431*d* of the second dry preventing liquid supply unit 2043*d* is positioned above the center of the substrate W1 while the substrate W1 held by the substrate holding unit 42 is rotated at a predetermined speed, or while the substrate W1 held by the substrate holding unit 42 is maintained in a stopped state, and a second dry preventing liquid 2L4 is supplied from the nozzle 2431*d* to the substrate W1. At this time, the controller 3 controls the operation of the second dry preventing liquid supply unit 2043*d* to control the supply timing, the supply time, and the supply amount of the second dry preventing liquid 2L4. In the second dry preventing supply step, a part of the first dry preventing liquid 2L3 remaining on the substrate W1 is replaced with the second dry preventing liquid 2L4. Accordingly, the surface of the substrate W1 is in a state of being filled with a mixed liquid of the first dry preventing liquid 2L3 and the second dry preventing liquid 2L4.

The second dry preventing liquid 2L4 filled on the substrate W1 functions as a dry preventing liquid to suppress occurrence of pattern collapse due to the drying of the surface of the substrate during the conveyance of the substrate from the cleaning processing unit 4 to the dry processing unit 5 and the carry of the substrate into the dry processing unit 5. In the exemplary embodiment, a part of the first dry preventing liquid 2L3 filled on the surface of the substrate is replaced with the second dry preventing liquid 2L4. However, since the first dry preventing liquid 2L3 alone is able to function as a dry preventing liquid, a part of the first dry preventing liquid 2L3 filled on the surface of the substrate may not be replaced with the second dry preventing liquid 2L4. When IPA is used as the first dry preventing liquid 2L3, PGMEA may be used as the second dry preventing liquid 2L4, so that a part of the IPA filled on the surface of the substrate is replaced with the PGMEA. Accordingly, the drying of the surface of the substrate may be suppressed as compared with a case of IPA alone, thereby enhancing the function as a dry preventing liquid. Further, unlike IPA, PGMEA does not have OH groups. Thus, PGMEA does not form a Lewis acid or a complex with a metal such as, for example, tungsten (W), and does not cause any damage such as W whisker. From these points, a part of the IPA filled on the surface of the substrate may be replaced with PGMEA.

<Step of Carrying Substrate into Dry Processing Unit>

The substrate W2 which have been subjected to a substrate processing by the cleaning processing unit 4 is in a wet state by the dry preventing liquid (e.g., a mixed liquid of the first dry preventing liquid 2L3 and the second dry preventing liquid 2L4) filled on the surface thereof. While maintaining the wet state, the substrate W2 is carried out from the cleaning processing unit 4 and carried into the dry processing unit 5. At this time, the conveyance mechanism 222 takes out the substrate W2 from the cleaning processing unit 4, and carries the taken-out substrate W2 into the dry processing unit 5. The conveyance mechanism 222 may have, for example, a cooling mechanism or a cover mechanism to suppress vaporization (evaporation) of the dry preventing liquid (e.g., a mixed liquid of the first dry preventing liquid 2L3 and the second dry preventing liquid 2L4) filled on the surface of the substrate W2 from the substrate W2 during the conveyance.

The substrate W2 carried into the dry processing unit 5 is held by the substrate holding unit 531 waiting at the external position of the chamber 510. At this time, the power supply unit 521 is OFF, and the internal space 511 of the supercritical processing chamber 510 is at a temperature equal to or lower than the critical temperature of the dialkyl ether G and atmospheric pressure. An inert gas (e.g., $N_2$ gas) is purged into the internal space 511 of the chamber 510 to keep the inside of the chamber 510 in a low oxygen atmosphere, and heating in the chamber 510 is started by the heating unit 52. Then, it is desirable that a combustible gas (e.g., IPA or MTBE) is not brought into contact with a relatively high concentration of oxygen under a high temperature atmosphere.

<Dialkyl Ether Supply Step>

When the substrate holding unit 531 holding the substrate W2 is positioned at the external position of the chamber 510, a first dialkyl ether supply unit 57a supplies a liquid dialkyl ether G to the substrate W2 held by the substrate holding unit 531. The first dialkyl ether supply unit 57a supplies the liquid dialkyl ether G, for example, until the substrate W2 held by the substrate holding unit 531 is immersed in the liquid dialkyl ether G, or until the liquid dialkyl ether G is filled on the surface of the substrate W2 held by the substrate holding unit 531.

<Dry Step>

After the dialkyl ether G is supplied to the substrate W2, the substrate holding unit 531 is moved from the external position of the chamber 510 to the internal position of the chamber 510 through the opening 512 of the chamber 510 such that the substrate W2 is accommodated in the chamber 510 while being held by the substrate holding unit 531. When the substrate holding unit 531 is moved to the internal position of the chamber 510, the opening 512 is sealed by the cover member 532, so that the inside of the chamber 510 is closed.

When the substrate holding unit 531 holding the substrate W2 is positioned at the internal position of the chamber 510, a second dialkyl ether supply unit 57b may supply the liquid dialkyl ether G to the substrate W2 held by the substrate holding unit 531 as necessary (for example, in order to compensate for the volatilization reduction of the dialkyl ether G supplied from the first dialkyl ether supply unit 57a).

After the substrate holding unit 531 holding the substrate W2 is accommodated in the chamber 510 (in the case where the liquid dialkyl ether G is supplied to the substrate W2 held by the substrate holding unit 531, by the second dialkyl ether supply unit 57b, after the supply thereof), the inside of the chamber 510 is heated by the heating unit 52. Specifically, power supply from the power supply unit 521 to the heating unit 52 is started, and the inside of the chamber 510 is heated by the heating unit 52. At this time, since the inside of the chamber 510 is pressurized by the vapor pressure of the dialkyl ether G, the dialkyl ether G on the substrate W2 is heated along the vapor pressure curve while being maintained in the liquid state. Further, a part of the dialkyl ether G is vaporized so that the pressure inside the chamber 510 is increased.

When the temperature-pressure state of the chamber 510 comes close to the critical point (critical temperature Tc and critical pressure Pc) of the dialkyl ether G, the dialkyl ether G is changed into a subcritical fluid. When the temperature-pressure state of the chamber 510 exceeds the critical point (critical temperature Tc and critical pressure Pc) of the dialkyl ether G, the dialkyl ether G is changed into a supercritical fluid. In practice, the atmosphere in the supercritical processing chamber 510 is in a state where the first dry preventing liquid 2L3, the second dry preventing liquid 2L4, and a fluid such as, for example, air flowing from the outside are mixed. However, when the dialkyl ether G is in a supercritical state or subcritical state, the liquid is dissolved so that no liquid surface is present inside the pattern. Therefore, when the dialkyl ether G comes into the supercritical state or subcritical state, the liquid on the surface may be removed from the substrate W2 without causing pattern collapse.

Thus, after the lapse of time sufficient for the dialkyl ether G in the chamber 510 to be changed into the supercritical fluid or subcritical fluid, the flow rate adjustor 542 (e.g., a valve) of the discharge line 541 is opened to discharge the fluid in the supercritical processing chamber 510. When the pressure inside the chamber 510 becomes equal to or lower than the critical pressure of the dialkyl ether G, the dialkyl ether G undergoes a phase change from the supercritical or subcritical fluid to a gas. At this time, when the temperature of the chamber 510 is adjusted to a temperature (e.g., 250° C.) equal to or higher than the boiling point of the hydrofluoroolefin, it is possible to discharge the fluid inside the chamber 510 from the chamber 510 in a state of a supercritical or subcritical fluid or a gas while suppressing reliquefaction of the dialkyl ether G As a result, in the chamber 510 which is depressurized to the atmospheric pressure, it is possible to obtain a dried substrate W3 from which the liquid has been removed from the surface thereof.

In the exemplary embodiment, the dialkyl ether G is used as a liquid which becomes a source of the supercritical or subcritical fluid. Since the dialkyl ether G does not have an OH group, the dialkyl ether G does not form a Lewis acid or a complex with a metal such as, for example, tungsten (W), and does not cause any damage such as W whisker. In addition, since the dialkyl ether G does not contain fluorine, no fluorine may be generated under a high temperature and high pressure condition which is used for changing a liquid into a supercritical fluid or a subcritical fluid. Thus, no damage is caused by fluorine.

<Step of Carrying Substrate out from Dry Processing Unit>

After the dry step, the substrate W3 is carried out from the dry processing unit 5. At this time, the conveyance mechanism 222 takes out the substrate W3 from the dry processing unit 5 and places the taken-out substrate W3 on the delivery unit 214. The conveyance mechanism 213 takes out the substrate W3 placed on the delivery unit 214 and stores the substrate W3 in the carrier C of the placing unit 211.

EXAMPLE

Reference Example 1

A silicon wafer having a concavo-convex pattern composed of convex portions and concave portions formed on its surface was sequentially immersed in deionized water (DIW) and isopropyl alcohol (IPA), and then taken out. The taken-out silicon wafer was immersed in about 2.5 mL of IPA in a test tube. Then, about 23 mL of perfluorocarbon (Fluorinert (registered trademark) FC-72 manufactured by Sumitomo 3M Limited) was added to the test tube. After the addition of FC-72, the test tube was introduced into the chamber, and a supercritical processing was performed in the chamber. The supercritical processing was performed by maintaining the temperature and pressure inside the chamber at 230° C. and 2.8 MPa for 20 minutes, respectively. Incidentally, 230° C. is a temperature higher than the critical temperature (175° C.) of FC-72, and 2.8 MPa is a pressure higher less than the critical pressure (1.9 MPa) of FC-72. After the supercritical processing, the inside of the chamber was depressurized, and the silicon wafer was taken out from the test tube.

After the supercritical processing, the concavo-convex pattern on the surface of the silicon wafer was observed by a scanning electron microscope (SEM), and conditions were set such that collapse of the concavo-convex pattern was not observed. As a result, the obtained conditions are as follows.

The liquid in the chamber reaches its critical temperature.
The entire liquid in the chamber changes to a supercritical fluid, subcritical fluid, or gas.
After supercritical processing, the pressure inside the chamber is reduced at a low speed (2 MPa/min).

The following examples and comparative examples were carried out according to the conditions obtained in Reference Example 1.

Reference Example 2

A silicon wafer having a concavo-convex pattern composed of convex portions and concave portions formed on its surface was sequentially immersed in deionized water (DIW) and isopropyl alcohol (IPA), and then taken out. The taken-out silicon wafer was immersed in about 2.5 mL of IPA in a test tube. Then, about 23 mL of perfluorocarbon (Fluorinert (registered trademark) FC-72 manufactured by Sumitomo 3M Limited) was added to the test tube. After the addition of FC-72, the test tube was introduced into the chamber, and a supercritical processing was performed in the chamber. The supercritical processing was performed by maintaining the temperature and pressure inside the chamber at 230° C. and 2.8 MPa for 20 minutes, respectively. Incidentally, 230° C. is a temperature higher than the critical temperature (175° C.) of FC-72, and 2.8 MPa is a pressure higher less than the critical pressure (1.9 MPa) of FC-72. After the supercritical processing, the inside of the chamber was depressurized, and the silicon wafer was taken out from the test tube.

After the supercritical processing, the concavo-convex pattern on the surface of the silicon wafer was observed by a scanning electron microscope (SEM), and conditions were set such that collapse of the concavo-convex pattern was not observed. As a result, the obtained conditions are as follows.

The entire chamber reaches the critical temperature of FC-72 (when a liquid other than FC-72 is used, the critical temperature of the liquid).
The entire liquid in the chamber changes to a critical fluid or gas.
After supercritical processing, the pressure inside the chamber is reduced at a low speed (2 MPa/min or less).

The following examples and comparative examples were carried out according to the conditions obtained in Reference Example 1.

Example 1

A silicon wafer having a concavo-convex pattern composed of convex portions and concave portions formed on its surface was sequentially immersed in deionized water (DIW) and isopropyl alcohol (IPA), and then taken out. The taken-out silicon wafer was immersed in about 2.5 mL of IPA in a test tube. Then, about 23 mL of hydrochlorofluoroolefin (HCFO) was added to the test tube. The HCFO used is CCK-1105 manufactured by Central Glass Co., Ltd. The common name for CCK-1105 is trans-1-chloro-3,3,3-trifluoropropene ((E)-CF$_3$CH=CHCl), and its alias is HCFO-1233zdE. CCK-115 has a boiling point of 18.4° C., a critical temperature of 167° C., a critical pressure of 3.6 MPa, and a GWP of 1, is in a liquid state at room temperature and a pressure near atmospheric pressure (0.2 MPa), and is miscible with IPA. After the addition of CCK-1105, the test tube was introduced into the chamber, and a supercritical processing was performed in the chamber. The supercritical processing was performed by maintaining the temperature and pressure inside the chamber at 200° C. and 4.8 MPa for 20 minutes, respectively. The critical temperature (calculated value) of the mixed liquid of IPA and CCK-1105 (IPA:CCK-1105=1:10 (volume ratio)) is 182° C., and the critical pressure (calculated value) is 4 MPa. After the supercritical processing, the inside of the chamber was depressurized, and the silicon wafer was taken out from the test tube. After the supercritical processing, the concavo-convex pattern on the surface of the silicon wafer was observed by a scanning electron microscope (SEM) to calculate the collapse rate of the concavo-convex pattern (collapsed concavo-convex pattern/all concavo-convex pattern×100). As a result, the collapse rate of the concavo-convex pattern was 0.8%.

Example 2

In Example 2, it was confirmed that the collapse suppressing effect of the concavo-convex pattern was different between the case of using CCK-1105 alone and the case of using a mixed liquid of IPA and CCK-1105.

(1) A silicon wafer having a concavo-convex pattern composed of convex portions and concave portions formed on its surface was placed in a test tube. Then, about 25 mL of a mixed liquid of IPA and CCK-1105 (IPA:CCK-1105=1:10 (volume ratio)) was added, and the silicon wafer was immersed in the mixed liquid of IPA and CCK-1105. The boiling point of the mixture of IPA and CCK-1105 is higher than the boiling point of CCK-1105 (18.4° C.). After the addition of the mixed liquid of IPA and CCK-1105, the test tube was introduced into the chamber, and a supercritical processing was performed in the chamber. The supercritical processing was performed by maintaining the temperature and pressure inside the chamber at 200° C. and 4.8 MPa for 15 minutes, respectively. The critical temperature (calculated value) of the mixed liquid of IPA and CCK-1105 (IPA:CCK-1105=1:10 (volume ratio)) is 182° C., and the critical pressure (calculated value) is 4 MPa. After the supercritical processing, the inside of the chamber was depressurized, and the silicon wafer was taken out from the test tube. After the supercritical processing, the concavo-convex pattern on the surface of the silicon wafer was observed by a scanning electron microscope (SEM) to calculate the collapse rate of the concavo-convex pattern (collapsed concavo-convex pattern/all concavo-convex pattern×100). As a result, the collapse rate of the concavo-convex pattern was 1.5%.

(2) A silicon wafer having a concavo-convex pattern composed of convex portions and concave portions formed on its surface was placed in a test tube. Then, about 25 mL of CCK-1105 was added alone, and the silicon wafer was immersed in CCK-1105. After the addition of CCK-1105, the test tube was introduced into the chamber, and a supercritical processing was performed in the chamber. The supercritical processing was performed by maintaining the temperature and pressure inside the chamber at 200° C. and 4.8 MPa for 15 minutes, respectively. The critical temperature of CCK-1105 is 167° C., and the critical pressure (calculated value) is 3.6 MPa. After the supercritical processing, the inside of the chamber was depressurized, and the silicon wafer was taken out from the test tube. After the supercritical processing, the concavo-convex pattern on the surface of the silicon wafer was observed by a scanning electron microscope (SEM) to calculate the collapse rate of the concavo-convex pattern (collapsed concavo-convex pattern/all concavo-convex pattern×100). As a result, the collapse rate of the concavo-convex pattern was 75.1%.

In the case where CCK-1105 was used alone, when CCK-1105 was added to the test tube, the silicon wafer was partially dried and the concavo-convex pattern was collapsed as soon as the first drop of CCK-1105 strikes the silicon wafer. In contrast, since the boiling point of the mixed liquid of IPA and CCK-1105 is higher than the boiling point of CCK-1105 (18.4° C.), using the mixed liquid of IPA and CCK-1105 did not cause collapse of the concavo-convex pattern, which occurred when CCK-1105 was used alone. Accordingly, in the case where HCFO having a boiling point lower than room temperature is used, it is desirable to use a mixed liquid of HCFO and an organic solvent having a higher boiling point than that of HCFO to enhance the collapse suppressing effect, as compared with using HCFO alone.

Example 3

The same operation as in (1) of Example 2 was carried out except that the temperature and the pressure in the chamber were set to (A) 164° C. and 3 MPa, (b) 171° C. and 3.6 MPa, (c) 182° C. and 4.2 MPa, (d) 192° C. and 4.5 MPa, (e) 200° C. and 4.8 MPa, (f) 155° C. and 2.5 MPa, and (g) 147° C. and 1.8 MPa. As a result, the collapse rate of the concavo-convex pattern was 2.4% in (a), 1.2% in (b), 0.4% in (c), 2.6% in (d), 1.8% in (e), 97.3% in (f), and 100% in (g). Considering that the critical temperature (calculated value) of the mixed liquid of IPA and CCK-1105 (IPA:CCK-1105=1:10 (volume ratio)) is 182° C. and the critical pressure (calculated value) is 4 MPa, the mixed liquid of IPA and CCK-1105 may be changed to a supercritical fluid or a subcritical fluid in the conditions of a) to (e), which result in a high effect of suppressing collapse of the concavo-convex pattern. In contrast, the mixed liquid of IPA and CCK-1105 may not be changed to a supercritical fluid or a subcritical fluid in the conditions (f) and (g), which result in a low effect of suppressing collapse of the concavo-convex pattern.

Example 4

The same operation as in Example 1 was carried out except that a commercially available hydrofluoroolefin (hereinafter referred to as "Hydrofluoroolefin A") was used in place of CCK-1105, and the supercritical processing was performed by maintaining the temperature and pressure in the chamber at 266° C. and 2.7 MPa for 20 minutes, respectively. The critical temperature of Hydrofluoroolefin A is 240° C., and the critical pressure (calculated value) is 1.8 MPa. After the supercritical processing, the concavo-convex pattern on the surface of the silicon wafer was observed by a scanning electron microscope (SEM). As a result, tapering of the concavo-convex pattern was observed. It is considered that the oxide film on the Si surface was etched by fluorine due to the difference in Si pillar diameter before and after the supercritical processing. It is thought that this fluorine was generated by hydrolysis of a low molecular weight ether component contained in Hydrofluoroolefin A. Although the amount of the fluorine generated is extremely small, it is considered that pattern damage occurred at a level that is visually discriminable because the chemical reaction was promoted under the high temperature and high pressure conditions in the supercritical process.

Example 5

A silicon wafer having a concavo-convex pattern composed of convex portions and concave portions formed on its surface was sequentially immersed in deionized water (DIW) and isopropyl alcohol (IPA), and then taken out. The taken-out silicon wafer was immersed in about 2.5 mL of IPA in a test tube. Then, about 23 mL of diisopropyl ether (DIPE) was added to the test tube. After the addition of DIPE, the test tube was introduced into the chamber, and a supercritical processing was performed in the chamber. The supercritical processing was performed by maintaining the temperature and pressure inside the chamber at 224° C. and 2.8 MPa for 20 minutes, respectively. Incidentally, 224° C. is a temperature near the critical temperature (227° C.) of DIPE, and 2.8 MPa is a pressure near the critical pressure (2.9 MPa) of DIPE. After the supercritical processing, the inside of the chamber was depressurized, and the silicon wafer was taken out from the test tube.

A large amount of viscous substances were adhered to the silicon wafer after the supercritical processing. Thus, observation of the concavo-convex pattern on the surface of the silicon wafer by the scanning electron microscope (SEM) was not performed.

Since DIPE generates a self-degradable and explosive component called organic peroxide by autoxidation in the atmosphere, an antioxidant (e.g., dibutyl hydroxytoluene (BHT)) is usually added to DIPE. It is considered that, since the boiling point (265° C.) of BHT is higher than the critical temperature (227° C.) of DIPE, BHT is not evaporated during the supercritical processing but is condensed, so that the viscous substance is generated as a residue.

Example 6

The same operation as in Example 1 was carried out except that a commercially available methyl tert-butyl ether (MTBE) was used in place of DIPE, and the supercritical processing was performed by maintaining the temperature and pressure in the chamber at 260° C. and 5.8 MPa for 20 minutes, respectively. Incidentally, 260° C. is a temperature higher than the critical temperature (224° C.) of MTBE, and 5.8 MPa is a pressure higher than the critical pressure (3.4 MPa) of MTBE.

After the supercritical processing, the concavo-convex pattern on the surface of the silicon wafer was observed by a scanning electron microscope (SEM). As a result, collapse of the concavo-convex pattern was slightly observed at the end portion of the silicon wafer, but collapse of the concavo-convex pattern was not observed in other portions.

In addition, adhesion of viscous substances observed in DIPE was not observed. Unlike DIPE, MTBE is hardly auto-oxidized in the atmosphere. Thus, it is not necessary to add an antioxidant such as BHT thereto. Therefore, 99.8% purity MTBE (high performance liquid chromatography grade) may be commercially available, and adhesion of viscous substances may be suppressed by using such a high purity MTBE.

Further, MTBE does not contain fluorine, and no fluorine is generated by the supercritical processing. Thus, pattern damage due to fluorine was not observed.

Comparative Example 1

The same operation as in Example 1 was carried out except that a commercially available hydrofluoroolefin (hereinafter referred to as "Hydrofluoroolefin A") was used in place of DIPE, and the supercritical processing was performed by maintaining the temperature and pressure in the chamber at 266° C. and 2.7 MPa for 20 minutes, respectively. Incidentally, 260° C. is a temperature higher than the critical temperature (240° C.) of Hydrofluoroolefin A, and 2.7 MPa is a pressure higher than the critical pressure (1.8 MPa) of the hydrofluoroolefin.

After the supercritical processing, the concavo-convex pattern on the surface of the silicon wafer was observed by a scanning electron microscope (SEM). As a result, tapering of the concavo-convex pattern was observed. It is considered that the oxide film on the Si surface was etched by fluorine due to the difference in Si pillar diameter before and after the supercritical processing. It is thought that this fluorine was generated by hydrolysis of a low molecular weight ether component contained in Hydrofluoroolefin A. Although the amount of the fluorine generated is extremely small, it is considered that pattern damage occurred at a level that is visually discriminable because the chemical reaction was promoted under the high temperature and high pressure conditions in the supercritical process.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
a dry processing unit that performs a dry processing to dry a substrate; and
a controller that controls an operation of the dry processing unit,
wherein the dry processing unit includes:
a chamber that accommodates the substrate;
a supercritical processing liquid supply unit that includes a reservoir that stores a processing liquid containing hydrofluoroolefin, and supplies the processing liquid to the substrate;
a substrate holder moving between an external position of the chamber and an internal position of the chamber while holding the substrate;
a heater that heats an inside of the chamber;
a discharger configured to discharge a fluid in the chamber from the chamber, and
a recycler configured to regenerate a liquid from the fluid discharged by the discharger,
wherein the controller is configured to control the dry processing unit such that when the substrate is held by the substrate holder at the external position, the processing liquid is supplied to the substrate by the supercritical processing liquid supply unit and the recycler regenerates a liquid from a gas evaporated from the processing liquid supplied to the substrate before the substrate is accommodated in the chamber, and when the substrate is accommodated in the chamber and the chamber is closed, the inside of the chamber is heated by the heater such that a vapor pressure of the processing liquid, as the processing liquid is heated, pressurizes the chamber to change the processing liquid into a subcritical fluid when a temperature-pressure state of the chamber approaches a critical temperature and pressure of the processing liquid, or a supercritical fluid when the temperature-pressure state of the chamber exceeds the critical temperature and pressure of the processing liquid, and then, the supercritical fluid or the subcritical fluid is discharged from the chamber by the discharger.

2. The substrate processing apparatus of claim 1, wherein the hydrofluoroolefin is hydrochlorofluoroolefin.

3. The substrate processing apparatus of claim 1, wherein the recycler is further configured to supply the regenerated liquids to the reservoir.

4. The substrate processing apparatus of claim 3, wherein the dry processing unit further includes a concentration adjuster that adjusts a concentration of the processing liquid stored in the reservoir, and
the controller controls the concentration adjuster such that after the liquids regenerated by the recycler are supplied to the reservoir, the concentration of the processing liquid stored in the reservoir is adjusted to a predetermined concentration.

5. The substrate processing apparatus of claim 1, wherein the controller controls the supercritical processing liquid supply unit and the substrate holder such that the processing liquid is additionally configured to be supplied to the substrate held by the substrate holder when the substrate holder is positioned at the internal position.

6. The substrate processing apparatus of claim 5, wherein the dry processing unit further includes a concentration adjuster that adjusts a concentration of the processing liquid stored in the reservoir, and
the controller controls the concentration adjuster such that the liquids regenerated by the recycler are supplied to the reservoir, and then, the concentration of the processing liquid stored in the reservoir is adjusted to a predetermined concentration.

7. The substrate processing apparatus of claim 1, wherein the processing liquid contains an organic solvent having a boiling point higher than that of the hydrofluoroolefin.

8. The substrate processing apparatus of claim 7, wherein a dry preventing liquid for preventing drying of the substrate is supplied to a surface of the substrate before the processing liquid is supplied to the surface of the substrate,
the dry preventing liquid contains an organic solvent, and
the organic solvent contained in the dry preventing liquid and the organic solvent contained in the processing liquid are the same in kind.

9. The substrate processing apparatus of claim 1, wherein the dry processing unit further includes a cooler that cools the processing liquid stored in the reservoir.

10. A substrate processing apparatus comprising:
a dry processing unit that performs a dry processing to dry a substrate; and
a controller that controls operations of the dry processing unit,
wherein the dry processing unit includes:
a chamber that accommodates the substrate;
a dialkyl ether supply unit that includes a reservoir that stores and supplies a liquid dialkyl ether represented by $R^1$—O—$R^2$ (wherein $R^1$ and $R^2$ represent the same or different alkyl groups) to the substrate;
a substrate holder moving between an external position of the chamber and an internal position of the chamber while holding the substrate;
a heater that heats an inside of the chamber;
a discharger configured to discharge a fluid in the chamber from the chamber, and
a recycler configured to regenerate a liquid from the fluid discharged by the discharger,
wherein the controller is configured to control the dry processing unit such that when the substrate is held by the substrate holder at the external position, the liquid dialkyl ether is supplied to the substrate by the dialkyl ether supply unit and the recycler regenerates a liquid from a gas evaporated from the liquid dialkyl ether supplied to the substrate before the substrate is accommodated in the chamber and when the substrate is accommodated in the chamber and the chamber is closed, the inside of the chamber is heated by the heater such that a vapor pressure of the liquid dialkyl ether, as the liquid dialkyl ether is heated, pressurizes the chamber to change the liquid dialkyl ether into a subcritical fluid when a temperature-pressure state of the chamber approaches a critical temperature and pressure of the liquid dialkyl ether, or a supercritical fluid when the temperature-pressure state of the chamber exceeds the critical temperature and pressure of the liquid dialkyl ether, and then, the supercritical fluid or the subcritical fluid is discharged from the chamber by the discharger.

11. The substrate processing apparatus of claim 10, wherein the liquid dialkyl ether is methyl tert-butyl ether.

12. The substrate processing apparatus of claim 10, wherein a dry preventing liquid for preventing drying of the substrate is supplied to a surface of the substrate before the liquid dialkyl ether is supplied to the surface of the substrate.

13. The substrate processing apparatus of claim 12, wherein the dry preventing liquid contains isopropyl alcohol.

14. The substrate processing apparatus of claim 12, wherein the dry preventing liquid contains propylene glycol monomethyl ether acetate.

* * * * *